(12) United States Patent
Wang et al.

(10) Patent No.: US 12,072,181 B2
(45) Date of Patent: Aug. 27, 2024

(54) INSPECTION APPARATUS AND METHOD

(71) Applicant: ASML NETHERLANDS B.V., Veldhoven (NL)

(72) Inventors: Yan Wang, San Jose, CA (US); Jian Zhang, San Jose, CA (US); Zhiwen Kang, San Jose, CA (US); Yixiang Wang, Fremont, CA (US)

(73) Assignee: ASML NETHERLANDS B.V., Veldhoven (NL)

( * ) Notice: Subject to any disclaimer, the term of this patent is extended or adjusted under 35 U.S.C. 154(b) by 178 days.

(21) Appl. No.: 17/487,896

(22) Filed: Sep. 28, 2021

(65) Prior Publication Data
US 2022/0107176 A1 Apr. 7, 2022

Related U.S. Application Data

(60) Provisional application No. 63/086,293, filed on Oct. 1, 2020.

(51) Int. Cl.
*G01B 15/08* (2006.01)
*H01J 37/20* (2006.01)
(Continued)

(52) U.S. Cl.
CPC .............. *G01B 15/08* (2013.01); *H01J 37/20* (2013.01); *H01J 37/21* (2013.01); *H01J 37/222* (2013.01);
(Continued)

(58) Field of Classification Search
CPC ..... G01B 15/08; G01B 11/0608; H01J 37/00; H01J 37/02; H01J 37/20; H01J 37/21;
(Continued)

(56) References Cited

U.S. PATENT DOCUMENTS 5,166,529 A * 11/1992 Ando ................. H01J 37/304
250/492.2
5,414,515 A    5/1995 Kawashima
(Continued)

FOREIGN PATENT DOCUMENTS

EP    3091396        11/2016
JP    H04354320 A  * 12/1992
(Continued)

OTHER PUBLICATIONS

Office Action issued in corresponding Taiwanese Patent Application No. 110136407, dated Jan. 10, 2023.

*Primary Examiner* — Jason L McCormack
(74) *Attorney, Agent, or Firm* — Pillsbury Winthrop Shaw Pittman LLP

(57) ABSTRACT

An inspection apparatus for adjusting a working height for a substrate for multiple target heights is disclosed. The inspection apparatus includes a radiation source configured to provide a radiation beam and a beam splitter configured to split the radiation beam into multiple beamlets that each reflect off a substrate. Each beamlet contains light of multiple wavelengths. The inspection apparatus includes multiple light reflecting components, wherein each light reflecting component is associated with one of the beamlets reflecting off the substrate and is configured to support a different target height for the substrate by detecting a height or a levelness of the substrate based on the beamlet reflecting off the substrate.

20 Claims, 12 Drawing Sheets

(51) Int. Cl.
*H01J 37/21* (2006.01)
*H01J 37/22* (2006.01)
*H01J 37/28* (2006.01)

(52) U.S. Cl.
CPC ..... *H01J 37/28* (2013.01); *H01J 2237/20235* (2013.01); *H01J 2237/2814* (2013.01)

(58) Field of Classification Search
CPC .......... H01J 37/222; H01J 37/28; H01J 37/26; H01J 37/3177; H01J 37/1471; H01J 37/228; H01J 37/292; H01J 2237/20235; H01J 2237/2814; H01J 2237/216; H01J 2237/24592; H01J 2237/2817; H01J 2237/20292; H01J 2237/221; H01J 2237/2482; G03F 1/86
USPC .................................. 250/306, 307, 310, 311
See application file for complete search history.

(56) References Cited

U.S. PATENT DOCUMENTS

| | | | | |
|---|---|---|---|---|
| 6,657,216 | B1* | 12/2003 | Poris | G01B 11/0608 250/559.22 |
| 2006/0060781 | A1* | 3/2006 | Watanabe | B82Y 40/00 250/310 |
| 2011/0071784 | A1* | 3/2011 | Smith | G02B 7/28 356/369 |
| 2011/0284746 | A1* | 11/2011 | Shimakura | H01J 37/29 250/310 |
| 2019/0323835 | A1* | 10/2019 | Sekiguchi | H01J 37/28 |
| 2020/0035451 | A1* | 1/2020 | Pettibone | G01N 15/0227 |
| 2020/0133144 | A1 | 4/2020 | Schmitt-Weaver et al. | |
| 2020/0209522 | A1* | 7/2020 | Yamakawa | B23K 26/0643 |
| 2022/0026809 | A1 | 1/2022 | Schmitt-Weaver et al. | |

FOREIGN PATENT DOCUMENTS

| | | |
|---|---|---|
| JP | H04354320 A2 * | 12/1992 |
| JP | 2910327 | 9/1999 |
| TW | 202028850 | 8/2020 |
| WO | 2008046966 | 4/2008 |
| WO | 2019229826 | 12/2019 |
| WO | 2020136094 | 7/2020 |

\* cited by examiner

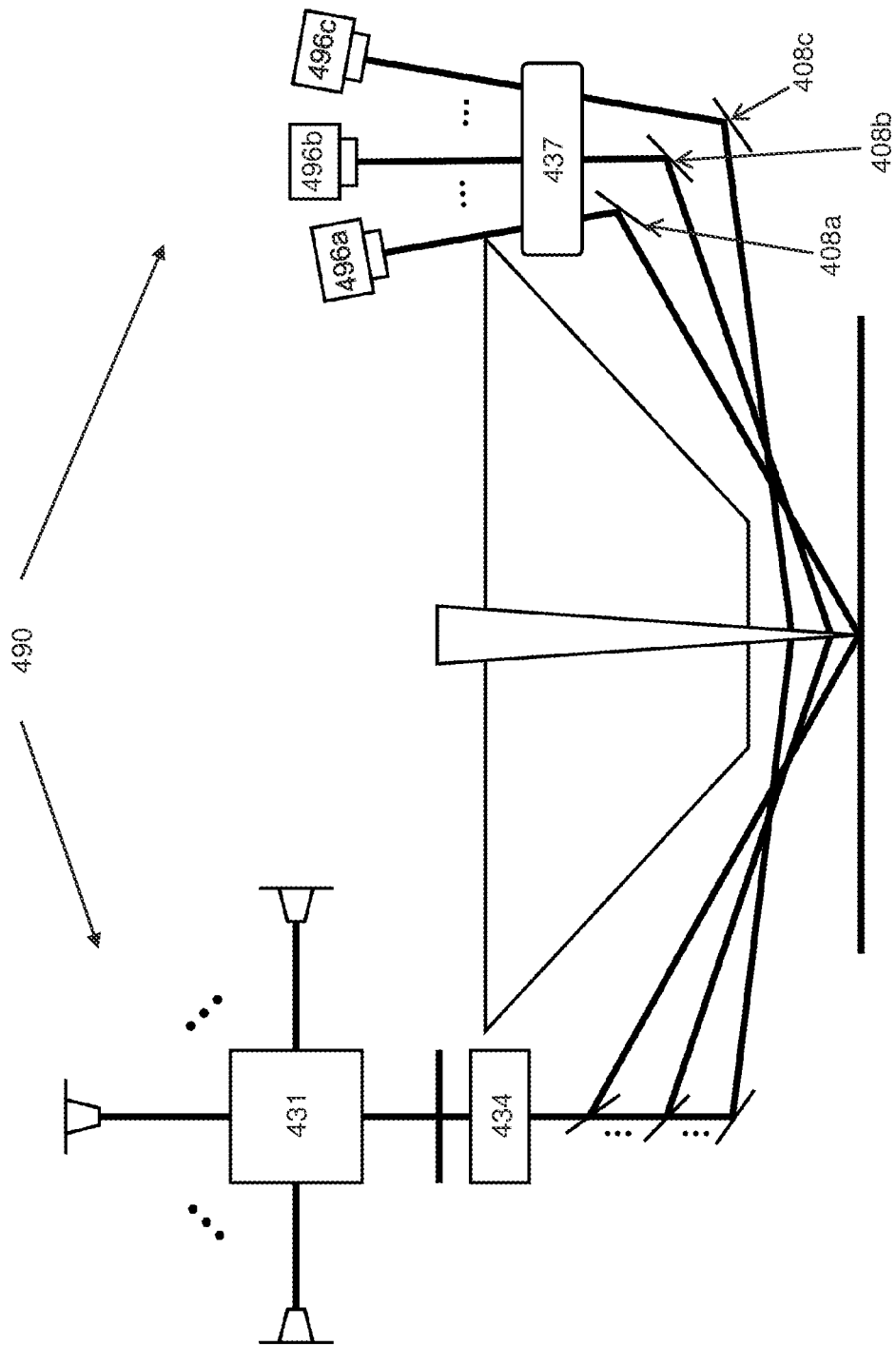

INSPECTION APPARATUS AND METHOD

This application claims the benefit of priority to U.S. patent application No. 63/086,293, filed on Oct. 1, 2020, and which is incorporated herein in its entirety by reference.

TECHNICAL FIELD

Embodiments herein relate to a level sensor in a charged-particle beam inspection apparatus, and more particularly to a multiple-working height level sensor.

BACKGROUND

In manufacturing processes of integrated circuits (ICs), unfinished or finished circuit components are inspected to ensure that they are manufactured according to design and are free of defects. Inspection systems utilizing optical microscopes or charged particle (e.g., electron) beam microscopes, such as a scanning electron microscope (SEM) can be employed. As the physical sizes of IC components continue to shrink, accuracy and yield in defect detection become more important.

However, imaging resolution and throughput of inspection tools struggles to keep pace with the ever-decreasing feature size of IC components. The accuracy, resolution, and throughput of such inspection tools may be limited by lack of accuracy in detecting a substrate displacement.

SUMMARY

The embodiments provided herein disclose a particle beam inspection apparatus, and more particularly, an inspection apparatus using a plurality of charged particle beams.

In some embodiments, there is provided an inspection apparatus that comprises a radiation source configured to provide a radiation beam; a beam splitter configured to split the radiation beam into multiple beamlets that each reflect off a substrate, wherein each beamlet contains light of multiple wavelengths; and multiple light reflecting components, wherein each light reflecting component is associated with one of the beamlets reflecting off the substrate and is configured to support a different target height for the substrate by detecting a height or a levelness of the substrate based on the beamlet reflecting off the substrate.

In some embodiments, there is provided a multi-working height inspection apparatus that comprises a stage configured to hold a substrate at one of a plurality of target heights, a level sensor and controller circuitry. The level sensor comprises (a) a radiation source configured to provide a radiation beam, (b) a beam splitter configured to split the radiation beam into multiple beamlets that each reflect off the substrate, wherein each beamlet contains light of multiple wavelengths, and multiple light reflecting components, wherein each light reflecting component is associated with one of the beamlets reflecting off the substrate and is configured to support a different target height for the substrate by detecting a height or a levelness of the substrate based on the beamlet reflecting off the substrate, and (c) a detector configured to detect an image from each of the beamlets that reflect off the substrate. The controller circuitry is configured to compare a first image of the images with a reference image corresponding to a first target height of the target heights to determine a deviation value for the substrate from the first target height.

In some embodiments, there is provided a method for adjusting a working height for a substrate in an inspection system comprising a level sensor, the method comprising: projecting a pattern on a substrate by a radiation beam from a radiation source of the level sensor, wherein the radiation beam is split into multiple beamlets that each reflect off the substrate, and wherein each beamlet contains light of multiple wavelengths; generating multiple images of the pattern by receiving the beamlets that reflect off the substrate, wherein each image is formed by a different beamlet and supports measurement of a deviation value of the substrate from a different target height; and determining a first deviation value of the substrate from a first target height based on a first image of the images that supports measurement of the deviation value of the substrate from the first target height.

In some embodiments, there is provided a non-transitory computer readable medium that stores a set of instructions that is executable by at least one processor of a computing device to cause the computing device to perform a method discussed above.

Other advantages of the embodiments of the present disclosure will become apparent from the following description taken in conjunction with the accompanying drawings wherein are set forth, by way of illustration and example, certain embodiments of the present invention.

BRIEF DESCRIPTION OF FIGURES

FIG. 4D shows a multi-working height leveling sensor, consistent with embodiments of the present disclosure.

DETAILED DESCRIPTION

Electronic devices are typically constructed of circuits formed on a piece of silicon called a substrate (e.g., a wafer). Many circuits may be formed together on the same piece of silicon and are called integrated circuits or ICs. The size of these circuits has decreased dramatically so that many more of them can fit on the substrate. For example, an IC chip in a smart phone can be as small as a thumbnail and yet may include over 2 billion transistors, the size of each transistor being less than 1/1000th the size of a human hair. Making these extremely small ICs is a complex, time-consuming, and expensive process, often involving hundreds of individual steps. Errors in even one step have the potential to result in defects in the finished IC rendering it useless. Thus, one goal of the manufacturing process is to avoid such defects to maximize the number of functional ICs made in the process, that is, to improve the overall yield of the process.

One component of improving yield is monitoring the chip making process to ensure that it is producing a sufficient number of functional integrated circuits. One way to monitor the process is to inspect the chip circuit structures at various stages of their formation. Inspection can be carried out using a scanning electron microscope (SEM). A SEM can be used to image these extremely small structures, in effect, taking a "picture" of the structures. The image can be used to determine if the structure was formed properly and also if it was formed in the proper location. If the structure is defective, then the process can be adjusted so the defect is less likely to recur.

Figure 2:
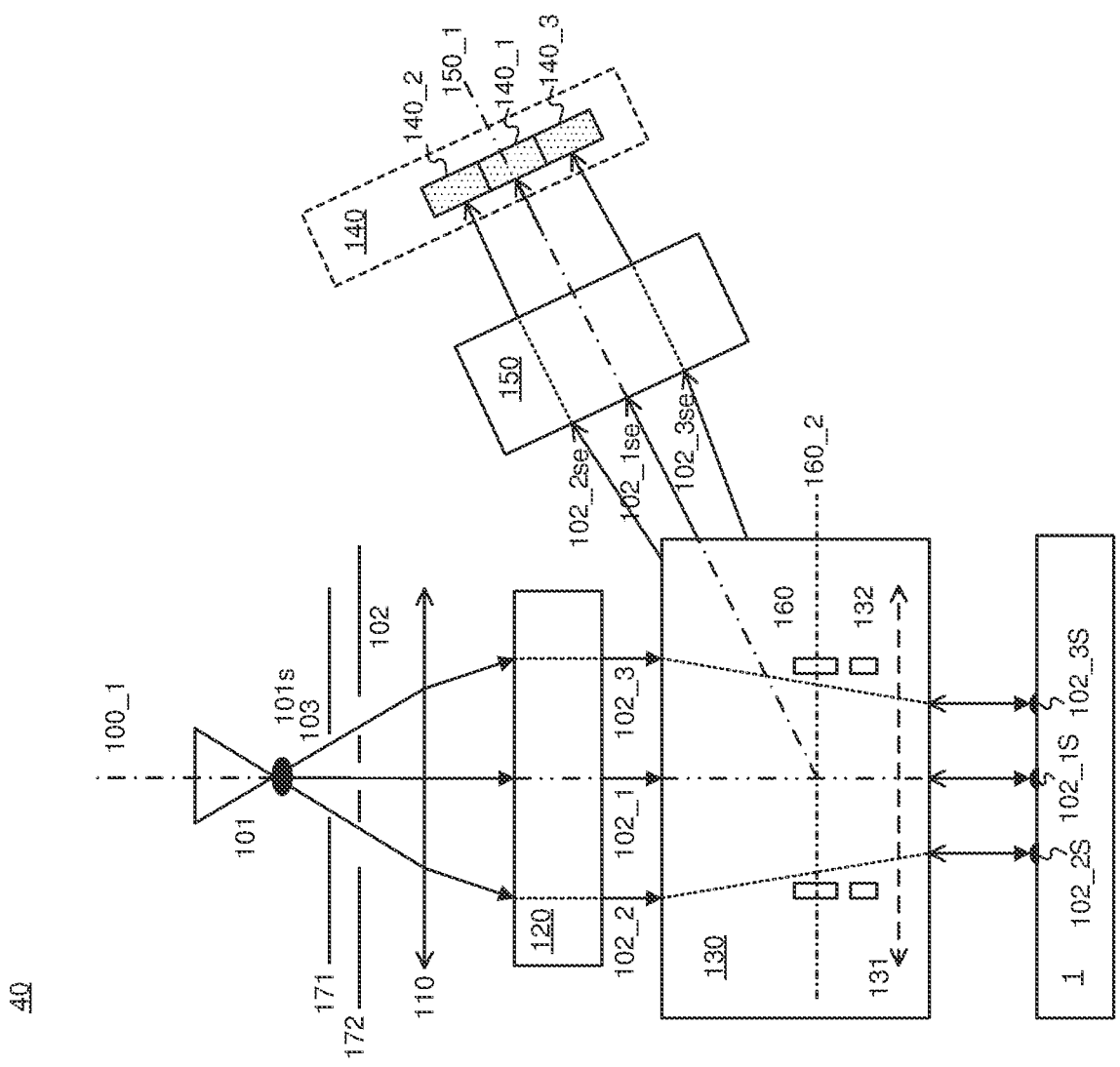
FIG. 2 is a schematic diagram illustrating an example electron beam tool that can be a part of the electron beam inspection system of FIG. 1, consistent with embodiments of the present disclosure.

In an electron beam inspection system, a leveling sensor (or Z-sensor) detects a height variation (e.g., in Z-axis) of an inspection sample (e.g., a substrate or wafer) to maintain the inspection sample at a target height to keep the inspection sample at the focus of a primary electron beam (e.g., 102 of FIG. 2). As the physical sizes of IC components decreases and a quality of an inspection image (e.g., SEM image) can significantly degrade with a slight displacement (e.g., tens of nanometers) between a beam focus and a sample height, highly sensitive detection of a height displacement of the sample is required. With the evolution of electron beam inspection systems, electron beams of various landing energies (LEs) may be used to image the inspection sample. As the landing energy changes, the focal point of the electron beam changes, which necessitates the target height of the inspection sample to be adjusted (e.g., distance between the inspection sample and the objective lens of the inspection system). These multi-landing energy systems involve detection of height displacement at multiple target heights to support various landing energies. For example, the target height may be 1.5 mm at one LE, and 4.5 mm at a second LE, and detection of height displacement and a level for the inspection sample may be needed at each of those target heights.

Prior Z-sensors have various limitations. For example, some existing Z-sensors can detect height variation for a single target height within a small dynamic range (e.g., ±0.1 mm). Some multi-target height Z-sensors have been proposed but they have drawbacks too. For example, some Z-sensors are not designed for broadband spectrum at multiple target heights, as they split wavelengths at different target heights, which may lead to inaccurate measurement of inspection samples having materials that are sensitive to narrowband spectrum. Some other Z-sensors are designed for using broadband spectrum, but they are not ideal as the components used may not be suitable for wide spectrum and may decrease the numerical aperture, thus decreasing the sensitivity. Moreover, such Z-sensors are quite complicated to build. Some Z-sensors use moving parts to detect the height of the inspection sample for different target heights, and such mobile components may lead to instability of the system. Further, some prior Z-sensors do not aid in detecting a level of the inspection sample with respect to a reference surface of the inspection system (e.g., the inspection sample being parallel to a column of the electron beam tool). Such Z-sensors may not ensure that the inspection sample is parallel to the column, and therefore, may lead to potential scratching and arcing of the inspection sample.

Embodiments of the present disclosure provide a multi-working height Z-sensor for detecting a height (or a deviation from a target height) of an inspection sample for multiple target heights with high accuracy. The Z-sensor may include a configurable broadband radiation source (e.g., light source), an optical lens group, light reflecting components (e.g., beam splitters or dichromic mirrors), and one or more detectors (e.g., charge-coupled device (CCD)/complementary metal-oxide semiconductor (CMOS) sensor-based camera). An advantage of such a multi-working height Z-sensor can be that it may facilitate detection of height variation of a greater range than the single target height Z-sensor since it enables measurement of a deviation of the inspection sample for different target heights. An advantage can be that the multi-working height Z-sensor may allow the use of electron beams of multiple landing energies in the same electron beam inspection system to enable high quality imaging of the inspection sample. An advantage may be that the effect of the materials on the substrate on the measurement of the deviation is minimized by using radiation of a number of wavelengths (e.g., wideband radiation of 250 nm-10 μm), which therefore, improves an accuracy of the measurement of the height of the inspection sample. Still another advantage is that the multi-working height Z-sensor enables detection of a tilt of the inspection sample, which may be used in aligning the inspection sample so that it is parallel to the reference surface. Further, it is also easier to build such a Z-sensor (e.g., no moving parts) and to retrofit or integrate it with current electron beam inspection systems.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations. Instead, they are merely examples of apparatuses and methods consistent with aspects related to the disclosed embodiments as recited in the appended claims. For example, although some embodiments are described in the context of utilizing electron beams, the disclosure is not so limited. Other types of charged particle beams may be similarly applied. Furthermore, other imaging systems may be used, such as optical imaging, photo detection, x-ray detection, etc.

Although specific reference may be made in this text to the manufacture of ICs, it should be explicitly understood that the description herein has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as interchangeable with the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm).

Figure 1:
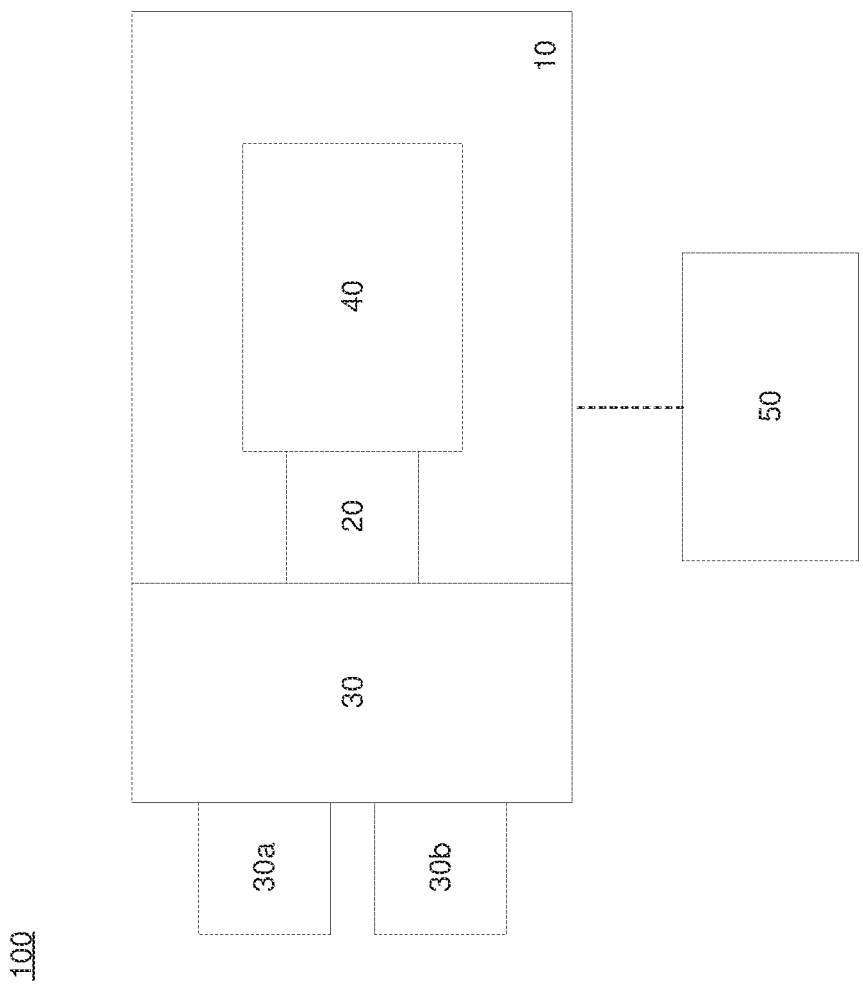
FIG. 1 is a schematic diagram illustrating an example electron beam inspection (EBI) system, consistent with embodiments of the present disclosure.

Reference is now made to FIG. 1, which illustrates an example electron beam inspection (EBI) system 100 consistent with embodiments of the present disclosure. As shown in FIG. 1, charged particle beam inspection system 100 includes a main chamber 10, a load-lock chamber 20, an electron beam tool 40, and an equipment front end module (EFEM) 30. Electron beam tool 40 is located within main chamber 10. While the description and drawings are directed to an electron beam, it is appreciated that the embodiments are not used to limit the present disclosure to specific charged particles.

EFEM 30 can include a first loading port 30a and a second loading port 30b. EFEM 30 may include additional loading port(s). First loading port 30a and second loading port 30b receive substrate front opening unified pods (FOUPs) that contain substrates (e.g., semiconductor wafers or wafers made of other material(s)) or samples to be inspected (substrates and samples are collectively referred to as "substrates" hereafter). One or more robot arms (not shown) in EFEM 30 transport the substrates to load-lock chamber 20.

Load-lock chamber 20 is connected to a load/lock vacuum pump system (not shown), which removes gas molecules in load-lock chamber 20 to reach a first pressure below the atmospheric pressure. After reaching the first pressure, one or more robot arms (not shown) transport the substrate from load-lock chamber 20 to main chamber 10. Main chamber 10 is connected to a main chamber vacuum pump system (not shown), which removes gas molecules in main chamber 10 to reach a second pressure below the first pressure. After reaching the second pressure, the substrate is subject to inspection by electron beam tool 40. In some embodiments, electron beam tool 40 may comprise a single-beam inspection tool. In other embodiments, electron beam tool 40 may comprise a multi-beam inspection tool.

Controller 50 may be electronically connected to electron beam tool 40 and may be electronically connected to other components as well. Controller 50 may be a computer configured to execute various controls of charged particle beam inspection system 100. Controller 50 may also include processing circuitry configured to execute various signal and image processing functions. While controller 50 is shown in FIG. 1 as being outside of the structure that includes main chamber 10, load-lock chamber 20, and EFEM 30, it is appreciated that controller 50 can be part of the structure.

While the present disclosure provides examples of main chamber 10 housing an electron beam inspection system, it should be noted that aspects of the disclosure in their broadest sense, are not limited to a chamber housing an electron beam inspection system. Rather, it is appreciated that the foregoing principles may be applied to other chambers as well.

Reference is now made to FIG. 2, which illustrates a schematic diagram illustrating an example electron beam tool 40 that can be a part of the example charged particle beam inspection system 100 of FIG. 1, consistent with embodiments of the present disclosure. An electron beam tool 40 (also referred to herein as apparatus 40) comprises an electron source 101, a gun aperture plate 171 with a gun aperture 103, a pre-beamlet forming mechanism 172, a condenser lens 110, a source conversion unit 120, a primary projection optical system 130, a sample stage (not shown in FIG. 2), a secondary imaging system 150, and an electron detection device 140. Primary projection optical system 130 can comprise an objective lens 131. Electron detection device 140 can comprise a plurality of detection elements 140_1, 140_2, and 140_3. Beam separator 160 and deflection scanning unit 132 can be placed inside primary projection optical system 130. It may be appreciated that other commonly known components of apparatus 40 may be added/omitted as appropriate.

Electron source 101, gun aperture plate 171, condenser lens 110, source conversion unit 120, beam separator 160, deflection scanning unit 132, and primary projection optical system 130 can be aligned with a primary optical axis 100_1 of apparatus 100. Secondary imaging system 150 and electron detection device 140 can be aligned with a secondary optical axis 150_1 of apparatus 40.

Electron source 101 can comprise a cathode, an extractor or an anode, wherein primary electrons can be emitted from the cathode and extracted or accelerated to form a primary electron beam 102 that forms a crossover (virtual or real) 101s. Primary electron beam 102 can be visualized as being emitted from crossover 101s.

Source conversion unit 120 may comprise an image-forming element array (not shown in FIG. 2), an aberration compensator array (not shown), a beam-limit aperture array (not shown), and a pre-bending micro-deflector array (not shown). The image-forming element array can comprise a plurality of micro-deflectors or micro-lenses to form a plurality of parallel images (virtual or real) of crossover 101s with a plurality of beamlets of primary electron beam 102. FIG. 2 shows three beamlets 102_1, 102_2, and 102_3 as an example, and it is appreciated that the source conversion unit 120 can handle any number of beamlets.

In some embodiments, source conversion unit 120 may be provided with beam-limit aperture array and image-forming element array (both are not shown). The beam-limit aperture array may comprise beam-limit apertures. It is appreciated that any number of apertures may be used, as appropriate. Beam-limit apertures may be configured to limit sizes of beamlets 102_1, 102_2, and 102_3 of primary electron beam 102. The image-forming element array may comprise image-forming deflectors (not shown) configured to deflect beamlets 102_1, 102_2, and 102_3 by varying angles towards primary optical axis 100_1. In some embodiments, deflectors further away from primary optical axis 100_1 may deflect beamlets to a greater extent. Furthermore, image-forming element array may comprise multiple layers (not illustrated), and deflectors may be provided in separate layers. Deflectors may be configured to be individually controlled independent from one another. In some embodiments, a deflector may be controlled to adjust a pitch of probe spots (e.g., 102_1S, 102_2S, and 102_3S) formed on a surface of sample 1. As referred to herein, pitch of the probe spots may be defined as the distance between two immediately adjacent probe spots on the surface of sample 1.

A centrally located deflector of image-forming element array may be aligned with primary optical axis 100_1 of electron beam tool 40. Thus, in some embodiments, a central deflector may be configured to maintain the trajectory of beamlet 102_1 to be straight. In some embodiments, the central deflector may be omitted. However, in some embodiments, primary electron source 101 may not necessarily be aligned with the center of source conversion unit 120. Furthermore, it is appreciated that while FIG. 2 shows a side view of apparatus 40 where beamlet 102_1 is on primary optical axis 100_1, beamlet 102_1 may be off primary optical axis 100_1 when viewed from a different side. That is, in some embodiments, all of beamlets 102_1, 102_2, and 102_3 may be off-axis. An off-axis component may be offset relative to primary optical axis 100_1.

The deflection angles of the deflected beamlets may be set based on one or more criteria. In some embodiments, deflectors may deflect off-axis beamlets radially outward or away (not illustrated) from primary optical axis 100_1. In some embodiments, deflectors may be configured to deflect off-axis beamlets radially inward or towards primary optical axis 100_1. Deflection angles of the beamlets may be set so that beamlets 102_1, 102_2, and 102_3 land perpendicularly on sample 1. Off-axis aberrations of images due to lenses, such as objective lens 131, may be reduced by adjusting paths of the beamlets passing through the lenses. Therefore, deflection angles of off-axis beamlets 102_2 and 102_3 may be set so that probe spots 102_2S and 102_3S have small aberrations. Beamlets may be deflected so as to pass through or close to the front focal point of objective lens 131 to decrease aberrations of off-axis probe spots 102_2S and 102_3S. In some embodiments, deflectors may be set to make beamlets 102_1, 102_2, and 102_3 land perpendicularly on sample 1 while probe spots 102_1S, 102_2S, and 102_3S have small aberrations.

Condenser lens 110 is configured to focus primary electron beam 102. The electric currents of beamlets 102_1, 102_2, and 102_3 downstream of source conversion unit 120 can be varied by adjusting the focusing power of condenser lens 110 or by changing the radial sizes of the corresponding beam-limit apertures within the beam-limit aperture array. The electric currents may be changed by both, altering the radial sizes of beam-limit apertures and the focusing power of condenser lens 110. Condenser lens 110 may be an adjustable condenser lens that may be configured so that the position of its first principle plane is movable. The adjustable condenser lens may be configured to be magnetic, which may result in off-axis beamlets 102_2 and 102_3 illuminating source conversion unit 120 with rotation angles. The rotation angles may change with the focusing power or the position of the first principal plane of the adjustable condenser lens. Accordingly, condenser lens 110 may be an anti-rotation condenser lens that may be configured to keep the rotation angles unchanged while the focusing power of condenser lens 110 is changed. In some embodiments, condenser lens 110 may be an adjustable anti-rotation condenser lens, in which the rotation angles do not change when the focusing power and the position of the first principal plane of condenser lens 110 are varied.

Electron beam tool 40 may comprise pre-beamlet forming mechanism 172. In some embodiments, electron source 101 may be configured to emit primary electrons and form a primary electron beam 102. In some embodiments, gun aperture plate 171 may be configured to block off peripheral electrons of primary electron beam 102 to reduce the Coulomb effect. In some embodiments, pre-beamlet-forming mechanism 172 further cuts the peripheral electrons of primary electron beam 102 to further reduce the Coulomb effect. Primary electron beam 102 may be trimmed into three primary electron beamlets 102_1, 102_2, and 102_3 (or any other number of beamlets) after passing through pre-beamlet forming mechanism 172. Electron source 101, gun aperture plate 171, pre-beamlet forming mechanism 172, and condenser lens 110 may be aligned with a primary optical axis 100_1 of electron beam tool 40.

Pre-beamlet forming mechanism 172 may comprise a Coulomb aperture array. A center aperture, also referred to herein as the on-axis aperture, of pre-beamlet-forming mechanism 172 and a central deflector of source conversion unit 120 may be aligned with primary optical axis 100_1 of electron beam tool 40. Pre-beamlet-forming mechanism 172 may be provided with a plurality of pre-trimming apertures (e.g., a Coulomb aperture array). In FIG. 2, the three beamlets 102_1, 102_2 and 102_3 are generated when primary electron beam 102 passes through the three pre-trimming apertures, and much of the remaining part of primary electron beam 102 is cut off. That is, pre-beamlet-forming mechanism 172 may trim much or most of the electrons from primary electron beam 102 that do not form the three beamlets 102_1, 102_2 and 102_3. Pre-beamlet-forming mechanism 172 may cut off electrons that will ultimately not be used to form probe spots 102_1S, 102_2S and 102_3S before primary electron beam 102 enters source conversion unit 120. In some embodiments, a gun aperture plate 171 may be provided close to electron source 101 to cut off electrons at an early stage, while pre-beamlet forming mechanism 172 may also be provided to further cut off electrons around a plurality of beamlets. Although FIG. 2 demonstrates three apertures of pre-beamlet forming mechanism 172, it is appreciated that there may be any number of apertures, as appropriate.

In some embodiments, pre-beamlet forming mechanism 172 may be placed below condenser lens 110. Placing pre-beamlet forming mechanism 172 closer to electron source 101 may more effectively reduce the Coulomb effect. In some embodiments, gun aperture plate 171 may be omitted when pre-beamlet forming mechanism 172 is able to be located sufficiently close to source 101 while still being manufacturable.

Objective lens 131 may be configured to focus beamlets 102_1, 102_2, and 102_3 onto a sample 1 for inspection and can form three probe spots 102_1s, 102_2s, and 102_3s on surface of sample 1. Gun aperture plate 171 can block off peripheral electrons of primary electron beam 102 not in use to reduce Coulomb interaction effects. Coulomb interaction effects can enlarge the size of each of probe spots 102_1s, 102_2s, and 102_3s, and therefore deteriorate inspection resolution.

Beam separator 160 may be a beam separator of Wien filter type comprising an electrostatic deflector generating an electrostatic dipole field E1 and a magnetic dipole field B1 (both of which are not shown in FIG. 2). If they are applied, the force exerted by electrostatic dipole field E1 on an electron of beamlets 102_1, 102_2, and 102_3 is equal in magnitude and opposite in direction to the force exerted on the electron by magnetic dipole field B1. Beamlets 102_1, 102_2, and 102_3 can therefore pass straight through beam separator 160 with zero deflection angles.

Deflection scanning unit 132 can deflect beamlets 102_1, 102_2, and 102_3 to scan probe spots 102_1s, 102_2s, and 102_3s over three small, scanned areas in a section of the surface of sample 1. In response to incidence of beamlets 102_1, 102_2, and 102_3 at probe spots 102_1s, 102_2s, and 102_3s, three secondary electron beams 102_1se, 102_2se, and 102_3se may be emitted from sample 1. Each of secondary electron beams 102_1se, 102_2se, and 102_3se can comprise electrons with a distribution of energies including secondary electrons (energies 50 eV) and backscattered electrons (energies between 50 eV and landing energies of beamlets 102_1, 102_2, and 102_3). Beam separator 160 can direct secondary electron beams 102_1se, 102_2se, and 102_3se towards secondary imaging system 150. Secondary imaging system 150 can focus secondary electron beams 102_1se, 102_2se, and 102_3se onto detection elements 140_1, 140_2, and 140_3 of electron detection device 140. Detection elements 140_1, 140_2, and 140_3 can detect corresponding secondary electron beams 102_1*se*, 102_2*se*, and 102_3*se* and generate corresponding signals used to construct images of the corresponding scanned areas of sample 1.

In FIG. 2, three secondary electron beams 102_1*se*, 102_2*se*, and 102_3*se* respectively generated by three probe spots 102_1S, 102_2S, and 102_3S, travel upward towards electron source 101 along primary optical axis 100_1, pass through objective lens 131 and deflection scanning unit 132 in succession. The three secondary electron beams 102_1*se*, 102_2*se* and 102_3*se* are diverted by beam separator 160 (such as a Wien Filter) to enter secondary imaging system 150 along secondary optical axis 150_1 thereof. Secondary imaging system 150 focuses the three secondary electron beams 102_1*se*~102_3*se* onto electron detection device 140 which comprises three detection elements 140_1, 140_2, and 140_3. Therefore, electron detection device 140 can simultaneously generate the images of the three scanned regions scanned by the three probe spots 102_1S, 102_2S and 102_3S, respectively. In some embodiments, electron detection device 140 and secondary imaging system 150 form one detection unit (not shown). In some embodiments, the electron optics elements on the paths of secondary electron beams such as, but not limited to, objective lens 131, deflection scanning unit 132, beam separator 160, secondary imaging system 150 and electron detection device 140, may form one detection system.

In some embodiments, controller 50 may comprise an image processing system that includes an image acquirer (not shown) and a storage (not shown). The image acquirer may comprise one or more processors. For example, the image acquirer may comprise a computer, server, mainframe host, terminals, personal computer, any kind of mobile computing devices, and the like, or a combination thereof. The image acquirer may be communicatively coupled to electron detection device 140 of apparatus 40 through a medium such as an electrical conductor, optical fiber cable, portable storage media, IR, Bluetooth, internet, wireless network, wireless radio, among others, or a combination thereof. In some embodiments, the image acquirer may receive a signal from electron detection device 140 and may construct an image. The image acquirer may thus acquire images of sample 1. The image acquirer may also perform various post-processing functions, such as generating contours, superimposing indicators on an acquired image, and the like. The image acquirer may be configured to perform adjustments of brightness and contrast, etc. of acquired images. In some embodiments, the storage may be a storage medium such as a hard disk, flash drive, cloud storage, random access memory (RAM), other types of computer readable memory, and the like. The storage may be coupled with the image acquirer and may be used for saving scanned raw image data as original images, and post-processed images.

In some embodiments, the image acquirer may acquire one or more images of a sample based on one or more imaging signals received from electron detection device 140. An imaging signal may correspond to a scanning operation for conducting charged particle imaging. An acquired image may be a single image comprising a plurality of imaging areas or may involve multiple images. The single image may be stored in the storage. The single image may be an original image that may be divided into a plurality of regions. Each of the regions may comprise one imaging area containing a feature of sample 1. The acquired images may comprise multiple images of a single imaging area of sample 1 sampled multiple times over a time sequence or may comprise multiple images of different imaging areas of sample 1. The multiple images may be stored in the storage. In some embodiments, controller 50 may be configured to perform image processing steps with the multiple images of the same location of sample 1.

In some embodiments, controller 50 may include measurement circuitries (e.g., analog-to-digital converters) to obtain a distribution of the detected secondary electrons. The electron distribution data collected during a detection time window, in combination with corresponding scan path data of each of primary beamlets 102_1, 102_2, and 102_3 incident on the substrate surface, can be used to reconstruct images of the substrate structures under inspection. The reconstructed images can be used to reveal various features of the internal or external structures of sample 1, and thereby can be used to reveal any defects that may exist in the substrate.

In some embodiments, controller 50 may control a motorized stage (not shown) to move sample 1 during inspection. In some embodiments, controller 50 may enable the motorized stage to move sample 1 in a direction continuously at a constant speed. In other embodiments, controller 50 may enable the motorized stage to change the speed of the movement of sample 1 over time depending on the steps of scanning process. In some embodiments, controller 50 may adjust a configuration of primary projection optical system 130 or secondary imaging system 150 based on images of secondary electron beams 102_1*se*, 102_2*se*, and 102_3*se*.

Although FIG. 2 shows that electron beam tool 40 uses three primary electron beams, it is appreciated that electron beam tool 40 may use two or more number of primary electron beams. The present disclosure does not limit the number of primary electron beams used in apparatus 40.

Figure 3A:
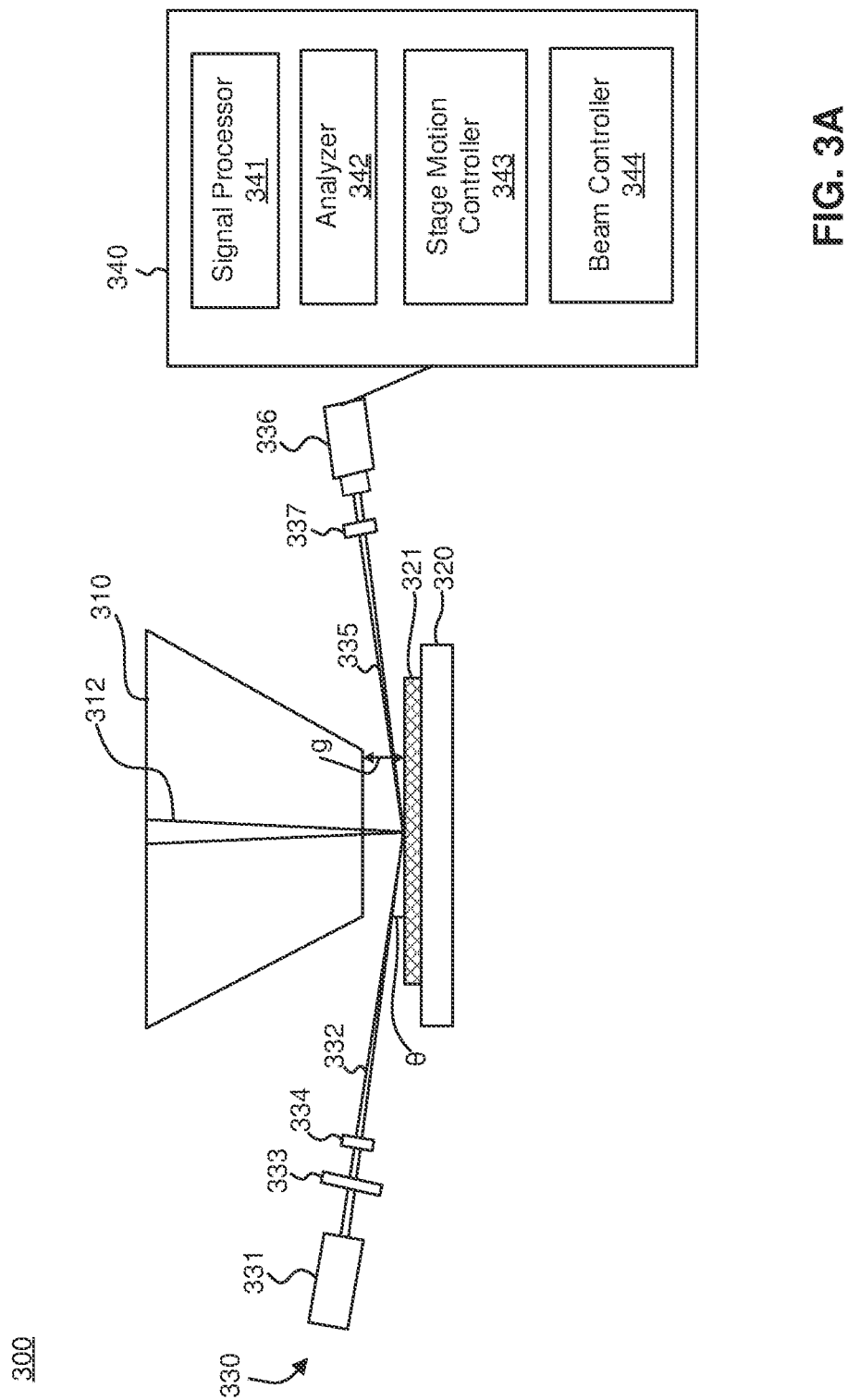
FIG. 3A is a schematic diagram illustrating an example inspection system comprising an example leveling sensor, consistent with embodiments of the present disclosure.

Reference is now made to FIG. 3A illustrating an inspection system 300 comprising an example leveling sensor, consistent with embodiments of the present disclosure. As shown in FIG. 3A, inspection system 300 includes an electron beam tool 310, a stage 320 on which a sample to be inspected (e.g., a substrate 321) is disposed, and a leveling sensor 330. Electron beam tool 310 may emit a primary electron beam 312 onto a region of interest (ROI) on substrate 321 and collect secondary electrons emanated from the substrate 321 to form an image of ROI on substrate 321. Inspection system 300 may be a part of EBI system 100 of FIG. 1 or electron beam tool 310 may be an electron beam tool 40 of FIG. 2. It is to be appreciated that, in the context of this disclosure, a charged-particle and an electron may be interchangeably used. Similarly, elements of the claimed apparatus or methods describing the charged-particle beam(s) may be interchangeably used with an electron beam(s), as appropriate.

In practice, substrate 321 may be observed at a high magnification in inspection system 300 while stage 320 stably supports substrate 321 and moves smoothly along, e.g., horizontal X-Y axes, vertical Z-axis, stage tilt, or stage rotation. While the movements in X and Y axis may be used for selection of a field of view (FOV), the movement in Z-axis may be required for change of image resolution, depth of focus, etc. In some embodiments, vertical displacement of stage 320 may be routinely determined for equipment calibration, based on height measurement or height sensing of standard specimens. For example, a substrate comprising standard patterned features, such as metal lines, photoresist layers, reflective films deposited on substrate, etc. may be used to calibrate equipment, sensors, motors, or stage. Substrate 321's surface is usually nonuniform since substrate 321 comprises patterned features and therefore a height of substrate 321 can be adjusted for image resolution while inspecting the substrate 321.

In some embodiments, leveling sensor 330 may be used for determining a vertical displacement of substrate 321. A vertical displacement of substrate 321, as referred to herein, may correspond to the difference between a target location and an actual location of substrate 321 in the Z-axis. Leveling sensor 330 may communicate with a height controller 340 (described later in detail) such that an output of leveling sensor 330 is analyzed and used to further adjust the substrate height or adjust a focal plane of the electron beam 312. One or more optical height sensors, such as, leveling sensor 330 may be employed based on the complexity and the accuracy of height sensing desired.

In some embodiments, leveling sensor 330 can comprise a radiation source 331 that projects a primary radiation beam 332 through a selective radiation passing object 333 onto substrate 321, and a detector 336 that captures an image of a secondary radiation beam 335 from substrate 321. A projection pattern formed by primary radiation beam 332 passing through selective radiation passing object 333 is projected onto substrate 321. Secondary radiation beam 335 may include a radiation beam scattered from a surface of substrate 321, a radiation beam diffracted from a surface of substrate 321, or a combination of a radiation beam scattered from a surface of substrate 321 and a radiation beam diffracted from a surface of substrate 321. The image of secondary radiation beam 335 can correspond to a projection pattern on substrate 321.

In some embodiments, leveling sensor 330 may further comprise a first optical system 334 between radiation source 331 and substrate 321 and a second optical system 337 between substrate 321 and detector 336. First optical system 334 can include one or more optical lenses that are configured to focus primary radiation beam 332 onto substrate 321. Second optical system 337 can include one or more optical lenses that are configured to focus secondary radiation beam 335 onto detector 336. Detector 360 may be a Charge-Coupled Device (CCD) camera or a Complementary Metal-Oxide-Semiconductor (CMOS) sensor that detects secondary radiation beam 335 to form an image of secondary radiation beam 335.

In some embodiments, leveling sensor 330 can be used to determine a height displacement of substrate 321 at a position on which primary electron beam 312 is focused such that a high resolution inspection image on a region of interest (e.g., a probe spot of primary electron beam 312) can be obtained.

Figure 3B:
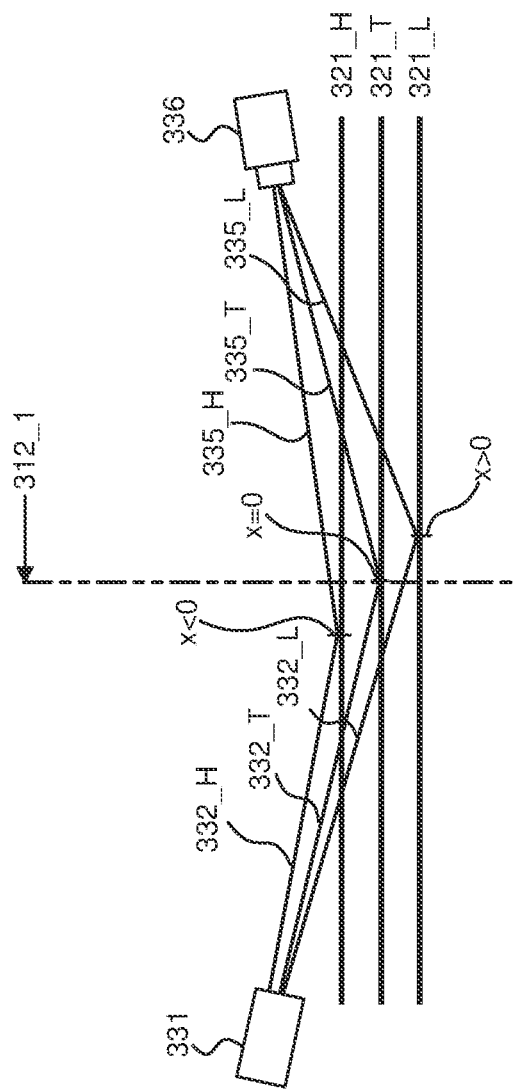
FIG. 3B is a schematic diagram illustrating an operation of a leveling sensor according to a substrate height, consistent with embodiments of the present disclosure.

Reference is now made to FIG. 3B, illustrating an operation of leveling sensor 330 according to a substrate height. In FIG. 3B, an optical axis of primary electron beam 312 is indicated as a vertical dotted line with a reference number 312_1 and a probe spot (e.g., 102_1S, 102_2S, or 102_3S) of primary electron beam 312 is indicated as being located at x=0 in an X-axis. As shown in FIG. 3B, when substrate 321 is positioned at target height 321_T in the Z-axis, a center of a projection pattern projected on substrate 321 matches a probe spot (i.e., x=0) of primary electron beam 312 on substrate 321. When substrate 321 is positioned at a higher position 321_H than target height 321_T, a center of a projected pattern does not match a target probe spot (i.e., the target probe spot being at x=0) of primary electron beam 312. Instead the center of the projected pattern may be positioned at a position x<0. According to embodiments of the present disclosure, based on an image obtained by detector 336, it can be determined that a height of substrate 321 needs to be lowered so that a center of a projected pattern moves to the right side, i.e., to x=0, to match with a focus of a targeted primary beam 312. When substrate 321 is positioned at a lower position 321_L than target height 321_T, a center of a projected pattern does not match a target probe spot (i.e., the target probe spot being at x=0) of primary electron beam 312. Instead the center of the projected pattern may be positioned at a position x>0. According to embodiments of the present disclosure, based on an image obtained by detector 336, it can be determined that a height of substrate 321 needs to be elevated so that a center of a projected pattern moves to the left side, i.e., to x=0, to match with a focus of a targeted primary beam 312.

Referring back to FIG. 3A, leveling sensor 330 may communicate with height controller 340 such that an output of leveling sensor 330 is analyzed and used to further adjust the substrate height. It is appreciated that height controller 340 may be part of or may be separate from a charged-particle beam inspection system (e.g., electron beam inspection system 100 of FIG. 1 or inspection system 300 of FIG. 3A). In some embodiments, height controller 340 may be part of controller 50 and may include an image acquirer, measurement circuitry, or storage, or the like. In some embodiments, height controller 340 may comprise an image processing system and may include an image acquirer, storage, or the like. It is also appreciated that in various embodiments, height controller 340 may be part of or may be separate from leveling sensor 330.

As shown in FIG. 3A, height controller 340 may comprise a signal processor 341 and an analyzer 342 according to embodiments of the present disclosure. Signal processor 341 may comprise one or more processors. For example, signal processor 341 may comprise a computer, server, mainframe host, terminals, personal computer, any kind of mobile computing devices, and the like, or a combination thereof. Signal processor 341 may be communicatively coupled to detector 336 through a medium such as an electrical conductor, optical fiber cable, portable storage media, IR, Bluetooth, internet, wireless network, wireless radio, among others, or a combination thereof. Signal processor 341 may be configured to receive a signal from detector 336 and to construct a radiation intensity image based on the signal from detector 336.

In some embodiments, analyzer 342 may be configured to determine whether substrate 321 is positioned in a target height or whether substrate 321 is displaced from the target height. Analyzer 342 may be further configured to determine a degree of a vertical displacement of substrate 321. In some embodiments, analyzer 342 is configured to cross-correlate measured data of a projected pattern on substrate 321 with reference data. In some embodiments, analyzer 342 can be configured to cross-correlate a radiation intensity image of a projected pattern on substrate 321 with a predetermined reference radiation intensity image. According to embodiments of the present disclosure, a reference radiation intensity image can be a radiation intensity image obtained by using a projection pattern equal to the projection pattern currently being used for inspecting target substrate 321. In some embodiments, a reference radiation intensity image can be obtained by projecting a projection pattern onto a nominal reference substrate and then by measuring a projected pattern of the projection pattern on the nominal reference substrate. Here, a reference substrate can have a flat surface and be placed at a target location (e.g., at a target height) when taking the reference radiation intensity image. In some embodiments, a reference radiation intensity image can be taken before inspecting target substrate 321 and stored in a storage (not shown) that can be located within or outside of inspection system 300. Analyzer 342 can have access to a reference radiation intensity image stored in a storage or can receive a reference radiation intensity image from a storage on demand.

In some embodiments, analyzer 342 can determine a vertical displacement of substrate 321 based on a cross-correlation result between a measured radiation intensity image corresponding a phase out projection pattern and a reference radiation intensity image. When a projected pattern's center does not match with a position x=0 (e.g., a focus of primary electron beam), a cross-correlation graph would have the largest peak value at x≠0. In some embodiments, analyzer 342 can determine a vertical displacement of substrate 321 based on the shift. For example, if the largest peak value of a cross-correlation graph lies at x=5, analyzer 342 can determine that substrate 321 should be lifted to move the center C of a projection pattern to a position x=0. If the largest peak value of a cross-correlation graph lies at x=−5, analyzer 342 can determine that substrate 321 should be lowered to move the center C of a projection pattern to a position x=0. In some embodiments, analyzer 342 can determine a vertical displacement of substrate 321 based on a shift amount of the largest peak value of a cross-correlation graph. In some embodiments, a relationship between a vertical displacement of substrate and a shift amount of the projected pattern can be preestablished based on experiments, measurements, tests, etc.

In some embodiments, height controller 340 can further include a stage motion controller 343 that is configured to adjust a height of substrate 321 according to the determined vertical displacement. Stage motion controller 343 may control stage 320 to move substrate 321 based on the vertical displacement determined by analyzer 342.

In some embodiments, height controller 340 can further include a beam controller 344 that is configured to adjust a focal plane of electron beam 312 according to the determined vertical displacement. Beam controller 344 may adjust landing energy (e.g., voltage) of electron beam 312 to move focus point of electron beam 312 up or down the z-axis based on the vertical displacement determined by analyzer 342.

The foregoing embodiments of FIGS. 3A and 3B discuss a leveling sensor 330 that may be used for determining a deviation or a vertical displacement of substrate 321 for a single target height (e.g., target height 321_T). The following paragraphs describe a leveling sensor that may be used for determining a vertical displacement of substrate 321 for multiple target heights. In some embodiments, a target height is a distance between a reference surface, such as surface 460 which is a bottom of electron beam tool 310, and a focal point of electron beam 312 in Z-axis. In other words, a target height is a distance between surface 460 of electron beam tool 310 and a target plane in z-axis at which electron beam 312 of a specified landing energy focuses on substrate 321.

Figure 4A:
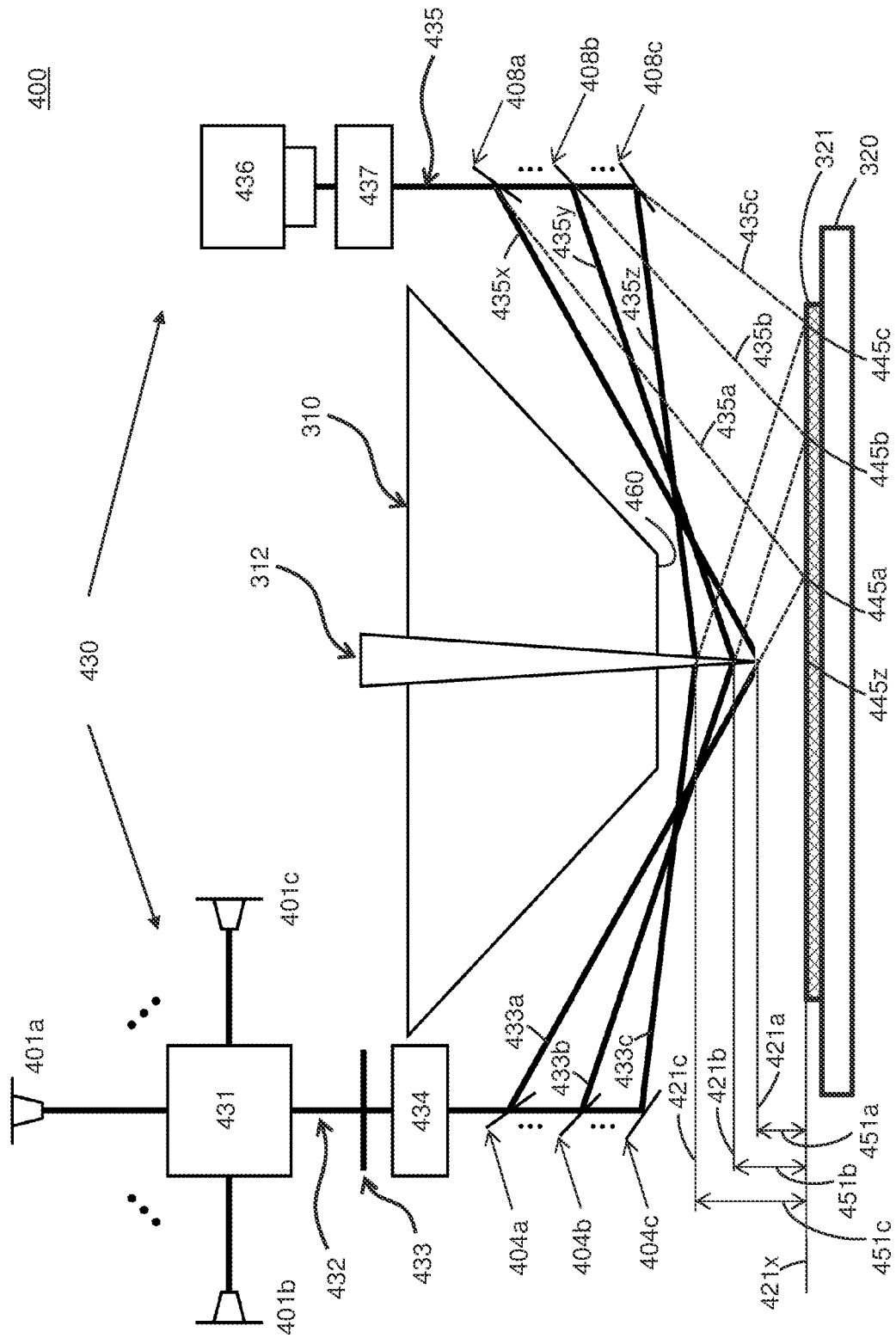
FIG. 4A shows an inspection system with a multi-working height leveling sensor, consistent with embodiments of the present disclosure.

FIG. 4A shows an inspection system 400 with a multi-working height leveling sensor 430, consistent with embodiments of the present disclosure. In some embodiments, inspection system 400 is similar to inspection system 300. Some inspection systems, such as inspection system 400, may use electron beams of various landing energies for inspecting substrate 321. As the landing energy changes, the focal point of the electron beam changes, which results in a need to position substrate 321 at varying heights (e.g., a first target height 421a, a second target height 421b, a third target height 421c, or other target heights). Thus, the multi-landing energy systems may require detection of height displacement of substrate 321 at each of the multiple target heights to support various landing energies. For example, first target height 421a may be 6 mm at a first landing energy of electron beam 312, second target height 421b may be 4.5 mm at a second landing energy of electron beam 312, and third target height 421c may be 1.5 mm at a third landing energy of electron beam 312, and leveling sensor 430 may have to detect vertical displacement and a level of substrate 321 at each of these target heights. The leveling sensor 430 may communicate with controller circuitry, such as height controller 340, such that an output of leveling sensor 430 is analyzed and used to further adjust the substrate height.

In some embodiments, leveling sensor 430 may include radiation source 431, beam splitter component 404, radiation receiving component 408, and a detector 436. The radiation source 431 projects primary radiation beam 432 through a selective radiation passing object 433 onto substrate 321. The beam splitter component 404 splits primary radiation beam 432 into a number of beamlets, such as beamlets 433a-c, each of which are projected onto substrate 321 at different locations of substrate 321. A projection pattern formed by primary radiation beam 332 passing through selective radiation passing object 333 is projected onto substrate 321 at different locations by primary beamlets 433a-c. Upon hitting the surface of substrate 321, primary beamlets 433a-c are reflected or diffracted off substrate 321 as secondary beamlets 435a-c, respectively. For example, primary beamlet 433a is reflected or diffracted off substrate 321, which is positioned at a current height 421x, as secondary beamlet 435a, primary beamlet 433b as secondary beamlet 435b, primary beamlet 433c as secondary beamlet 435c, and so on. The secondary beamlets 435a-c are received by radiation receiving component 408, which further directs secondary beamlets 435a-c to detector 436 as secondary radiation beam 435. The detector 436 detects the secondary beamlets 435a-c to form multiple images in which each image is formed by a different secondary beamlet 435a-c. For example, a first image is formed by secondary beamlet 435a, a second image is formed by a secondary beamlet 435b, a third image is formed by a secondary beamlet 435c, and so on. Further, each image corresponds to a projection pattern on substrate 321 on a different region of interest (ROI) on substrate 321. For example, the first image corresponds to an image of first ROI 445a, the second image corresponds to second ROI 445b, the third image corresponds to third ROI 445c, and so on.

In some embodiments, radiation receiving component 408 includes a number of radiation reflecting components, such as radiation reflecting components 408a-c. As an example, a radiation reflecting component may include a beam splitter, a dichromic mirror, or other radiation reflecting components. The radiation reflecting components 408a-c are arranged in specific angles to support different target heights (e.g., determination of a vertical displacement of substrate 321 for multiple target heights). That is, each radiation reflecting component is configured to aid in determination of a vertical displacement of substrate 321 for a different target height. For example, first radiation reflecting component 408a may be configured to aid in detection of a vertical displacement of substrate 321 for a first target height 421a, second radiation reflecting component 408b for second target height 421b, third radiation reflecting component 408c for third target height 421c, and so on.

The images detected by detector 436 are analyzed using height controller 340 to detect a vertical displacement of substrate 321 for a specific target height. As described at least with reference to FIGS. 3A and 3B, height controller 340 may be configured to determine a vertical displacement of substrate 321 for a specified target height by comparing a detected or measured image of a projected pattern on substrate 321 with a reference image. For example, to determine first vertical displacement 451a of substrate 321 with respect to first target height 421a, height controller 340 may be configured to compare the first image of a projected pattern on substrate 321 formed via first radiation reflecting component 408a that is configured to support first target height 421a with a reference image corresponding to first target height 421a. In some embodiments, a reference image may be obtained by projecting a projection pattern onto a nominal reference substrate positioned at a specified target height and then by measuring a projected pattern of the projection pattern on the nominal reference substrate. For example, a reference image corresponding to first target height 421a may be obtained by projecting a projection pattern onto a nominal reference substrate positioned at first target height 421a and then by measuring a projected pattern of the projection pattern on the nominal reference substrate. In some embodiments, comparing a detected image with a reference image may include cross-correlating a radiation intensity image of the detected image with a radiation intensity image of the reference image and determining the vertical displacement of substrate 321 based on the cross-correlation, as described at least with reference to FIGS. 3A and 3B or U.S. Provisional Patent Application No. 62/989,488, which is incorporated by reference in its entirety.

After determining first vertical displacement 451a, which is an amount of height substrate 321 has to move in Z-axis from its current height 421x to be positioned at first target height 421a, height controller 340 may cause a height of stage 320 to be adjusted based on the first vertical displacement 451a so that substrate 321 may be positioned at first target height 421a. For example, height controller 340 may generate a control signal that causes stage motion controller 343 to control stage 320 to move substrate 321 from a current height 421x based on first vertical displacement 451a to first target height 421a.

The vertical displacements for second target height 421b and third target height 421c may be determined similarly. For example, to determine second vertical displacement 451b of substrate 321 with respect to second target height 421b, height controller 340 may be configured to compare the second image of a projected pattern on substrate 321 formed via second light reflecting component 408b that is configured to support second target height 421b with a reference image corresponding to second target height 421b. In another example, to determine third vertical displacement 451c of substrate 321 with respect to third target height 421c, height controller 340 may be configured to compare the third image of a projected pattern on substrate 321 formed via third radiation reflecting component 408c that is configured to support third target height 421c with a reference image corresponding to third target height 421c.

While the foregoing paragraphs describe adjusting a height of stage 320 based on the vertical displacements 451a-c, in some embodiments, a focus point of electron beam 312 may be adjusted to compensate for the vertical displacement, in addition to or instead of adjusting the height of stage 320. For example, to compensate for first vertical displacement 451a of substrate 321 with respect to first target height 421a, beam controller 344 may be configured to adjust a focus point of electron beam 312 based on the first vertical displacement 451a such that electron beam 312 focuses at current height 421x instead of focusing at first target height 421a. In another example, beam controller 344 may be configured to adjust a focus point of electron beam 312 based on a portion of the first vertical displacement 451a such that electron beam 312 focuses at a specific height between current height 421x and first target height 421 at and stage motion controller 343 may be configured to adjust the height of stage 320 based on the remaining portion of first vertical displacement 451a such that stage 320 is positioned at the specific height. In some embodiments, beam controller 344 may change the focus point of electron beam 312 by adjusting a landing energy (e.g., voltage) of electron beam 312. Additional details with respect to adjusting a focus point of electron beam 312 to compensate for the vertical displacement is described in International Patent Application publication WO 2020/136094, which is hereby incorporated by reference.

In some embodiments, beam splitter component 404 includes a number of beam splitters, such as first beam splitter 404a, second beam splitter 404b, third beam splitter 404c, and so on. As an example, a beam splitter may be a prism, a mirror, or other beam splitting component. In some embodiments, the beam splitters may be a non-polarizing beam splitting element. In some embodiments, the beam splitters may be configured to have varied ratios of reflection to transmission, for example, to ensure that all beamlets 433a-c have the same energy when beamlets 433a-c hit the surface of substrate 321. The beam splitters may be configured in different angles so that each beam splitter directs a corresponding beamlet to a different target height. For example, first beam splitter 404a is positioned at an angle such that primary beamlet 433a is directed to first target height 421a, that is, primary beamlet 433a will be incident on, and corresponding secondary beamlet 435x will be reflected off substrate 321 from, desired probe spot 445z on substrate 321 when substrate 321 is positioned at first target height 421a. Continuing with the example, second beam splitter 404b may be positioned at an angle such that primary beamlet 433b is directed to second target height 421b, that is, primary beamlet 433b will be incident on, and corresponding secondary beamlet 435y will be reflected off substrate 321 from, desired probe spot 445z on substrate 321 when substrate 321 is positioned at second target height 421b. Similarly, third beam splitter 404c may be positioned at an angle such that primary beamlet 433c is directed to third target height 421c, that is, primary beamlet 433c will be incident on, and corresponding secondary beamlet 435z will be reflected off substrate 321 from, desired probe spot 445z on substrate 321 when substrate 321 is positioned at third target height 421c. In some embodiments, the probe spot 445z may be a portion of substrate 321 at which electron beam 312 of a specified landing energy focuses on when substrate 321 is positioned at a specified target height.

In some embodiments, beam splitter component 404 and radiation receiving component 408 may be arranged symmetrically in inspection system 400. For example, beam splitter component 404 and radiation receiving component 408 may be arranged symmetrically along an optical axis 312_1 (e.g., shown in FIG. 3B) of primary electron beam 312.

In some embodiments, detector 436, like detector 336, may be a CCD camera or a CMOS sensor that detects secondary radiation beam 435 to form multiple images in which each image corresponds to a different secondary beamlet 435a-c. In some embodiments, detector 436 may include multiple sensors in which each sensor detects a different image of the multiple images.

In some embodiments, radiation source 431 may include a configurable radiation source that may provide broadband radiation or a narrowband radiation. For example, radiation source 431 may combine radiation of different wavelengths to generate primary radiation beam 432 having a wide wavelength range (e.g., 250 nm-10 µm, or other ranges). Such wavelength ranges may be obtained by combining radiation from various types of sources, such as radiation sources 401a, 401b, or 401c. As an example, radiation sources 401a, 401b, or 401c may include light emitting diodes (LED), superluminescent diodes (SLD), laser diodes, quantum cascade laser, or other type of radiation sources. In some embodiments, radiation source 431 may combine radiation from radiation sources 401a, 401b, or 401c using a radiation merging component (e.g., X-cube prism, or other radiation combining components). The primary radiation beam 432 from radiation source 431 passing through beam splitter component 404 may be split into multiple primary beamlets 433a-c. In some embodiments, while primary radiation beam 432 is split into primary beamlets 433a-c, the wavelength of primary radiation beam 432 is not split across primary beamlets 433a-c and each of the primary beamlets 433a-c may have all wavelengths of primary radiation beam 432. Thus, each of the primary beamlets 433a-c may include broadband light if primary radiation beam 432 is of a broadband spectrum. In some embodiments, by using broadband light to image substrate 321, the effect of materials on the surface of substrate 321 in measuring the vertical displacement of substrate 321 may be minimized, as the variation of the material and its effects on measurement may be compensated by tuning the wavelength of primary radiation beam 432 within the broadband spectrum.

While leveling sensor 430 is different from leveling sensor 330 of FIG. 3A in that leveling sensor 430 may be used to determine a vertical displacement of substrate 321 for multiple target heights unlike leveling sensor 330, leveling sensor 430 may include at least some components that are similar to components of leveling sensor 330. For example, leveling sensor 430 may include first optical system 434, like first optical system 334, between radiation source 431 and substrate 321 and second optical system 437, like second optical system 337, between substrate 321 and detector 436. In some embodiments, first optical system 434 may include one or more optical lenses that are configured to focus primary radiation beam 432 onto substrate 321. In some embodiments, second optical system 437 may include one or more optical lenses that are configured to focus secondary radiation beam 435 onto detector 436.

In some embodiments, if substrate 321 has a tilt (e.g., not parallel to surface 460), substrate 321 may come in contact with surface 460 of electron beam tool 310 potentially resulting in scratching and arcing. Such adverse events may be prevented by determining a level of substrate 321 and correcting the level if substrate 321 is not parallel to surface 460. In some embodiments, leveling sensor 430 may also be used to determine a level of substrate 321 with respect to a reference surface of inspection system 400. For example, leveling sensor 430 may be used to determine whether substrate 321 is parallel to surface 460 of electron beam tool 310.

Figure 5:
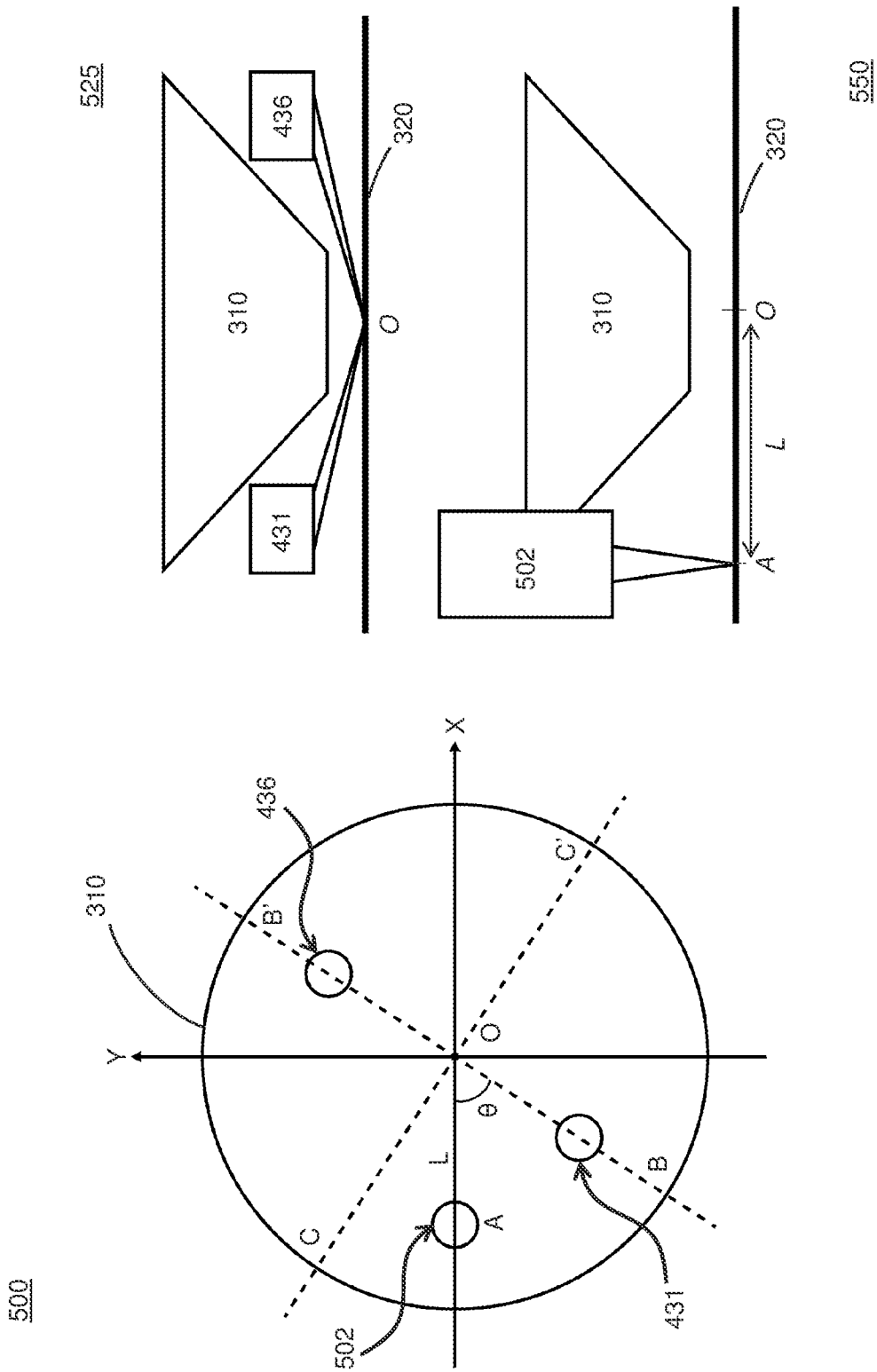
FIG. 5 is a schematic diagram illustrating an operation of a leveling sensor for determining a level of a substrate, consistent with embodiments of present disclosure.

FIG. 5 is a schematic diagram illustrating an operation of a leveling sensor for determining a level of a substrate, consistent with embodiments of present disclosure. FIG. 5 shows a top view 500 of electron beam tool 310 with leveling sensor 430 and an optical microscope 502 of inspection system 400, a front view 525 of electron beam tool 310 with leveling sensor 430, and a front view 550 of electron beam tool 310 with optical microscope 502. In some embodiments, inspection system 400 includes optical microscope 502, which may be used for various purposes, including imaging a pattern printed on substrate 321, aligning substrate 321 and other purposes. Optical microscope 502 may also be used with leveling sensor 430 for determining a level of substrate 321.

In some embodiments, a first height of stage 320 or substrate 321 at a specified target height may be measured (e.g., using leveling sensor 330 or leveling sensor 430) by measuring a substrate surface profile along level sensor's axis BB' using the equation:

$$z(k) = \frac{H(k)}{2M} + (k\cos\varphi)^{\frac{1}{\cos\varphi}}\left[\int \frac{H'(k)}{2M}(k\cos\varphi)^{-\frac{1}{\cos\varphi}} dk + C\right] \quad (1A)$$

where z(k) is the height at position k, H(k) is the pattern shift on detector 436, M is the magnification and φ is the primary radiation beam incident angle. This first height at position "k=0," which is the center of electron beam tool 310, is measured using eq. (1) and may be referred to as z (0). The constant C may be measured based on height at two or more positions. For example, for k=0, we have:

$$z1(0) = \frac{H1(0)}{2M} \quad (1B)$$

By shifting the stage from k=0 to another position along the x-axis, e.g., k=a, we have:

$$z2(a) = \frac{H2(a)}{2M} + (a\cos\varphi)^{\frac{1}{\cos\varphi}}\left[\int \frac{H2'(x)}{2M}(x\cos\varphi)^{-\frac{1}{\cos\varphi}} dx \,\bigg|\, x = a + C\right] \quad (1C)$$

The constant, C, may be determined by equating Eqs. 1B and 1C as below:

$$z1(0) = z2(a) \quad (1D)$$

A first tilt angle, α, between electron beam tool 310 and substrate 321 along an axis CC' perpendicular to the axis BB' of leveling sensor 430 may be expressed as:

$$\alpha(k) \cong \frac{dz(k)}{dk} \quad (2)$$

In some embodiments, since electron beam tool 310 and substrate 321 may rotate along the projection direction BB', a single dimension information may not be sufficient to align substrate 321 with surface 460. In some embodiments, to guarantee that substrate 321 is parallel to surface 460 of electron beam tool 310, tilt measurement in another direction may be needed. Such an additional tilt measurement may be obtained using an existing component of inspection system 400 such as optical microscope 502, thereby eliminating the need for a new sensor. The top view 500 shows the relative location of leveling sensor 430 and optical microscope 502 in inspection system 400. In some embodiments, optical microscope 502 may be positioned along x-axis of the substrate to get a measurement of tilt along y-axis of substrate 321. The height of stage 320 may be adjusted to a focus plane of optical microscope 502 to obtain a clear image of substrate 321, which height is referred to as $Z_A$. The second tilt, β, of substrate 321 along y-axis may be represented using equation:

$$\beta = \frac{z_A - z(0)}{L} \quad (3)$$

where L is the distance between center "O" of electron beam tool 310 and center "A" of optical microscope 502.

Based on the first tilt, α, along the axis CC' and second tilt, β, along the y-axis, a third tilt, y, along the x-axis may be calculated as follows:

$$\tan\alpha = \frac{Z''}{\sqrt{X''^2 + Y''^2}} \quad (4)$$

$$X'' = \cos\theta\cos\beta \quad (5)$$

$$Y'' = \sin\theta\cos\gamma + \cos\theta\sin\gamma\sin\beta \quad (6)$$

$$Z'' = \sin\theta\sin\gamma - \cos\alpha\sin\beta\cos\gamma \quad (7)$$

where θ is the angle between the x-axis and the BB' axis of leveling sensor 430. By solving the above equations, the third tilt, y, along the x-axis may be obtained.

In some embodiments, the above measurements of various tilts may be obtained using height controller 340. After obtaining one or more of the above tilt measurements, height controller 340 may be configured to adjust the height of stage 320 based on the above tilt measurements such that substrate 321 is parallel to surface 460 of electron beam tool 310.

The height controller 340 may be implemented in various ways. For example, height controller 340 may be part of leveling sensor 430. In another example, height controller 340 may be part of SEM, which is used to obtain images of substrate 321. In another example, height controller 340 may be implemented in a distributed manner, e.g., a first portion in inspection system 400 and a second portion in a computer system remote to inspection system 400, such as a cloud-based system. In the cloud-based system implementation, in some embodiments, the first portion of height controller 340 may transmit the images captured by detector 436 to the second portion of height controller 340 in the cloud-based system. The second portion of the height controller 340 may analyze the images to determine the vertical displacement or levelness of substrate 321 and transmit control signals to the first portion to adjust stage 320. The first portion may then adjust stage 320 based on the vertical displacement or levelness of substrate 321 to ensure that substrate 321 is at a specified target height or is parallel to surface 460 of electron beam tool 310.

Figure 4B:
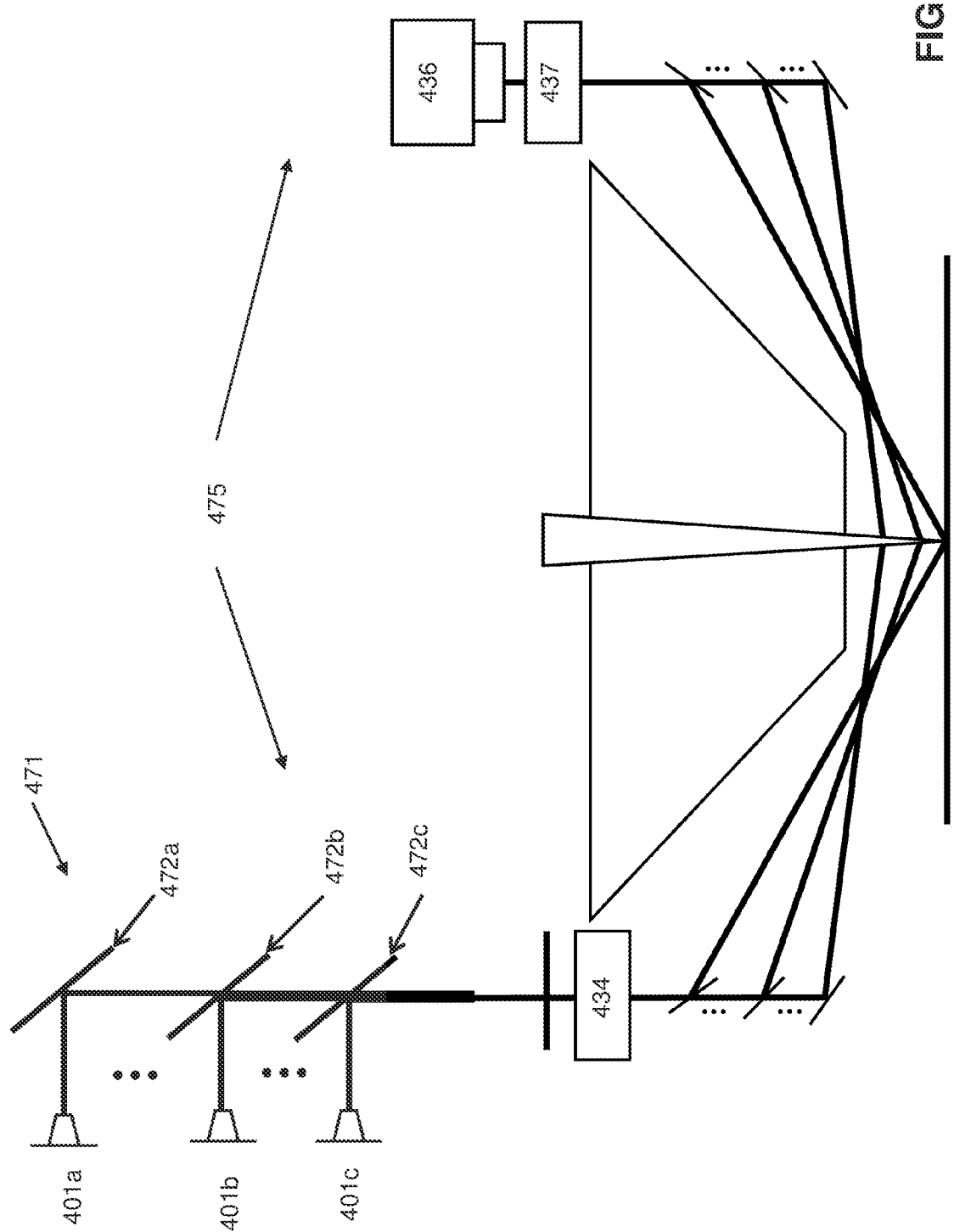
FIG. 4B shows a multi-working height leveling sensor, consistent with embodiments of the present disclosure.

FIG. 4B shows a second multi-working height leveling sensor 475, consistent with embodiments of the present disclosure. In some embodiments, second multi-working height leveling sensor 475 may operate in a way similar to multi-working height leveling sensor 430 of FIG. 4A. However, radiation source 471 of second multi-working height leveling sensor 475 may be configured differently from radiation source 431 of leveling sensor 430. For example, radiation source 471 may combine radiation from radiation sources 401a, 401b, or 401c with different wavelength using dichromic mirrors 472a, 472b, or 472c to generate primary radiation beam 432. Other components of leveling sensor 475 operate similar to leveling sensor 430 and therefore their description has been omitted for brevity.

Figure 4C:
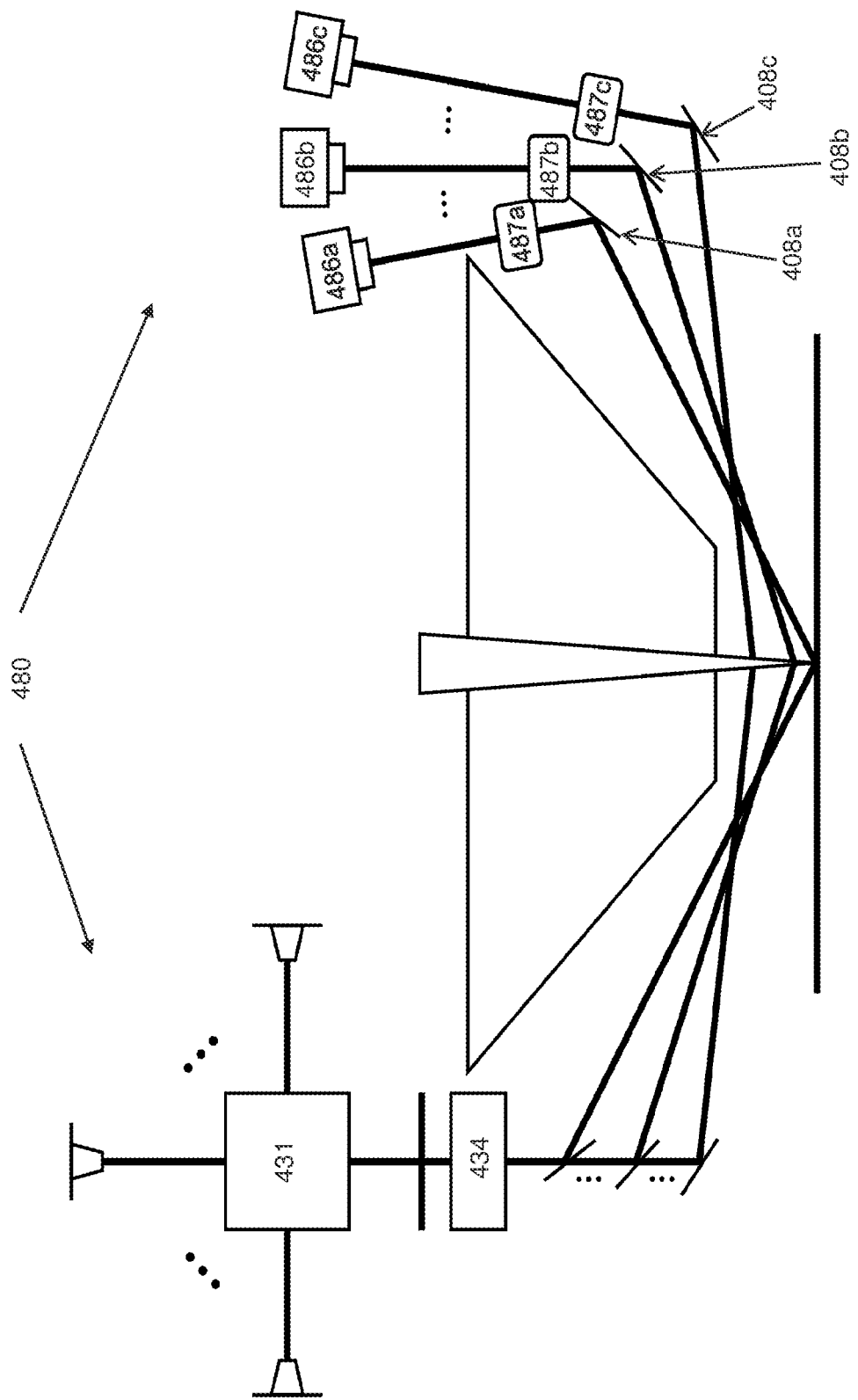
FIG. 4C shows a multi-working height leveling sensor, consistent with embodiments of the present disclosure.

FIG. 4C shows a third multi-working height leveling sensor 480, consistent with embodiments of the present disclosure. In some embodiments, third multi-working height leveling sensor 480 may operate in a way similar to multi-working height leveling sensor 430 of FIG. 4A. However, third multi-working height leveling sensor 480 may have multiple detectors 486a-c, unlike leveling sensor 430 which may have a single detector 436. Similarly, third multi-working height leveling sensor 480 may have multiple optical lenses 487a-c between substrate 321 and detectors 486a-c, unlike leveling sensor 430 which may have a single optical lens system 437. In some embodiments, each secondary beamlet (e.g., secondary beamlets 435a-c) that is reflected off or diffracted off substrate 321 is directed by radiation receiving component 408 to a different optical lens-detector pair in leveling sensor 480. For example, first radiation reflecting component 408a, which is configured to support first target height 421a, is configured to direct secondary beamlet 435a to optical lens 487a and detector 486a pair. Similarly, second radiation reflecting component 408b, which is configured to support second target height 421b, is configured to direct secondary beamlet 435b to optical lens 487b and detector 486b pair. Similarly, third radiation reflecting component 408c, which is configured to support third target height 421c, is configured to direct secondary beamlet 435c to optical lens 487c and detector 486c pair. Accordingly, each of the detectors 486a-c has a different image corresponding to a different target height.

The radiation reflecting components 408a-c of leveling sensor 480 may include a beam splitter, a dichromic mirror, or other radiation reflecting components. In some embodiments, radiation reflecting components 408a-c are dichromic mirrors. Other components of leveling sensor 480 operate similar to leveling sensor 430 and therefore their description has been omitted for brevity.

FIG. 4D shows a fourth multi-working height leveling sensor 490, consistent with embodiments of the present disclosure. In some embodiments, fourth multi-working height leveling sensor 490 may operate in a way similar to multi-working height leveling sensor 430 of FIG. 4A. However, fourth multi-working height leveling sensor 490 may have multiple detectors 496a-c, unlike leveling sensor 430 which may have a single detector 436. In some embodiments, each secondary beamlet (e.g., secondary beamlets 435a-c) that is reflected off or diffracted off substrate 321 is directed by radiation receiving component 408 to a different detector in leveling sensor 480. For example, first radiation reflecting component 408a, which is configured to support first target height 421a, is configured to direct secondary beamlet 435a to detector 496a. Similarly, second radiation reflecting component 408b, which is configured to support second target height 421b, is configured to direct secondary beamlet 435b to detector 496b. Similarly, third radiation reflecting component 408c, which is configured to support third target height 421c, is configured to direct secondary beamlet 435c to detector 496c. Accordingly, each of the detectors 496a-c has a different image corresponding to a different target height.

The radiation reflecting components 408a-c of leveling sensor 490 may include a beam splitter, a dichromic mirror, or other radiation reflecting components. In some embodiments, radiation reflecting components 408a-c are dichromic mirrors. Other components of leveling sensor 490 operate similar to leveling sensor 430 and therefore their description has been omitted for brevity.

Figure 6:
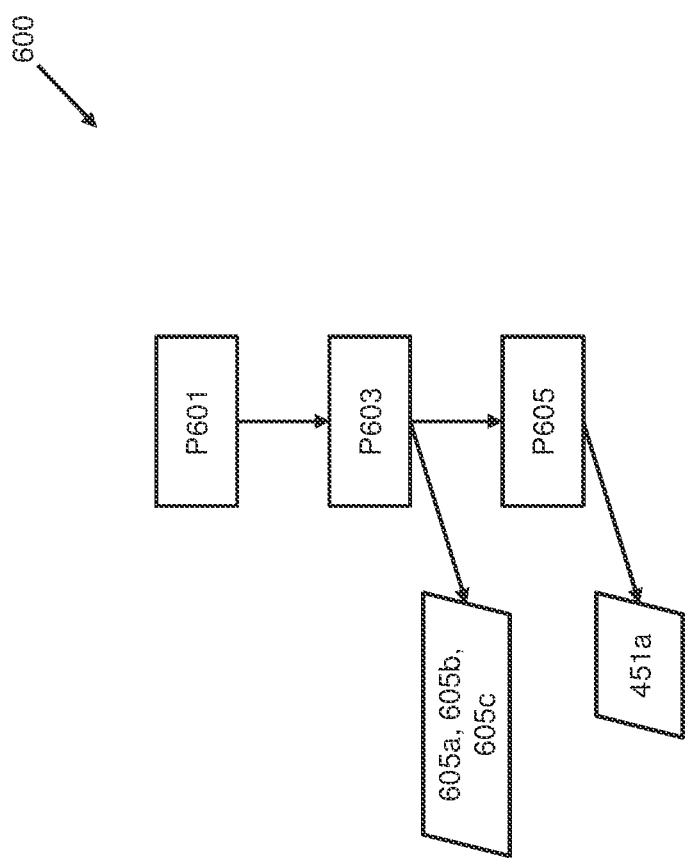
FIG. 6 is a flow diagram of a process for determining a deviation value or vertical displacement of a substrate for multiple target heights, consistent with embodiments of the present disclosure.

FIG. 6 is a flow diagram of a process 600 for determining a deviation value or vertical displacement of a substrate for multiple target heights, consistent with embodiments of the present disclosure. At operation P601, a radiation beam from a radiation source of a level sensor (e.g., leveling sensor 430) is passed through a pattern to project the pattern on a substrate. For example, primary radiation beam 432 is passed through selective radiation passing object 433 to project a corresponding pattern on substrate 321. In some embodiments, primary radiation beam 432 is split into multiple beamlets (e.g., primary beamlets 433a-c) that each reflect off substrate 321. Each beamlet may contain radiation of multiple wavelengths (e.g., all wavelengths of primary radiation beam 432, which may be of a broadband spectrum). The primary beamlets 433a-c reflect off substrate 321 as secondary beamlets 435a-c, respectively.

At operation P603, multiple images 605 of the pattern are generated based on beamlets that reflect off substrate 321. In some embodiments, each image is formed by a different beamlet and supports measurement of a deviation value (or vertical displacement) of substrate 321 for a different target height. For example, first image 605a is formed based on secondary beamlet 435a and supports measurement of first vertical displacement 451a of substrate 321 with respect to first target height 421a (e.g., as described at least with reference to FIG. 4A). Similarly, second image 605b is formed based on secondary beamlet 435b and supports measurement of second vertical displacement 451b of substrate 321 with respect to second target height 421b. Similarly, third image 605c is formed based on secondary beamlet 435c and supports measurement of third vertical displacement 451c of substrate 321 with respect to third target height 421c.

At operation P605, first vertical displacement 451a of substrate 321 from first target height 421a is determined based on first image 605a that supports measurement of the vertical displacement of substrate 321 for first target height 421a. For example, first image 605a is compared with a reference image corresponding to first target height 421a (e.g., as described at least with reference to FIGS. 3A, 3B, 4A) and first vertical displacement 451a is determined based on the comparison.

After determining first vertical displacement 451a, which is an amount of height substrate 321 has to move in Z-axis from its current height 421x to be positioned at first target height 421a, height controller 340 may cause a height of stage 320 to be adjusted based on first vertical displacement 451a so that substrate 321 may be positioned at first target height 421a. Alternatively, or in addition to adjusting height of stage 320, height controller 340 may cause a focus point of electron beam 312 to be adjusted, e.g., focus at current height 421x instead of first target height 421a, based on first vertical displacement 451a.

Figure 7:
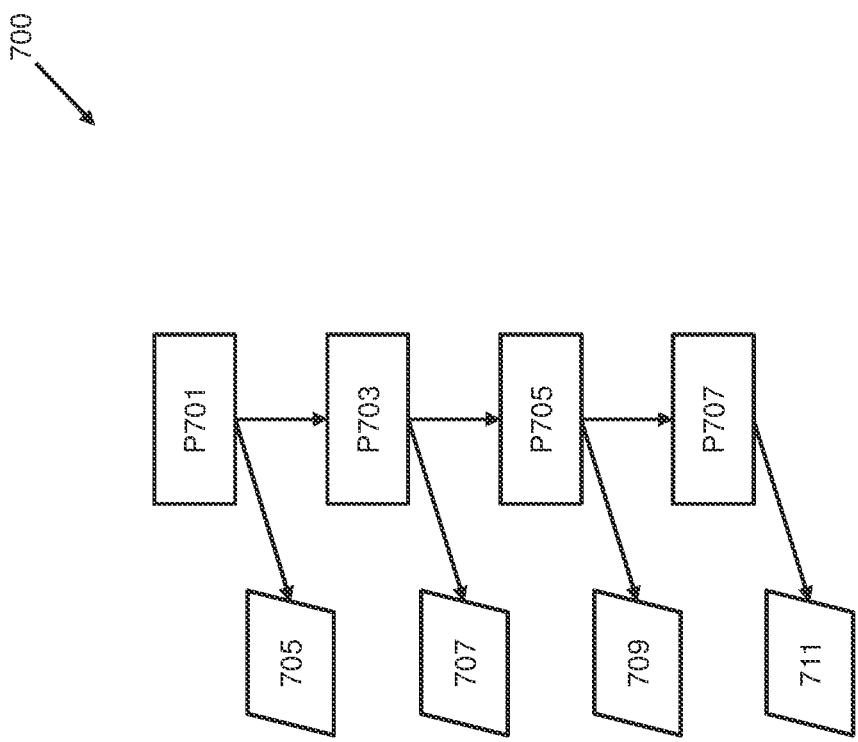
FIG. 7 is a flow diagram of a process for determining a levelness of a substrate, consistent with embodiments of the present disclosure.

FIG. 7 is a flow diagram of a process 700 for determining a levelness of a substrate, consistent with embodiments of the present disclosure. At operation P701, a first height of substrate 321 is obtained using a leveling sensor (e.g., leveling sensor 430). For example, first height 705, z(O), at position "O," which is the center of electron beam tool 310, is measured using eq. (1) as described at least with reference to FIG. 5.

At operation P703, a first tilt of substrate 321 along a first axis is determined based on first height 705. For example, first tilt 707, α, between electron beam tool 310 and substrate 321 along an axis CC' perpendicular to axis BB' of leveling sensor 430 is obtained based on first height 705 using eq. (2) as described at least with reference to FIG. 5.

At operation P705, a second tilt of substrate 321 along a y-axis is determined based on first height 705, a second height measured from an x-axis of substrate 321, and a distance between a reference point of the inspection system and a center of an optical microscope of the inspection system on the x-axis. In some embodiments, the second height corresponds to a height at which substrate 321 is in a focus plane of optical microscope 502. Accordingly, height of stage 320 is adjusted until substrate 321 is in a focus plane of optical microscope 502, which is the second height, $Z_A$. In some embodiments, the distance, L, is determined as a distance between center "O" of electron beam tool 310 and center "A" of optical microscope 502. The second tilt 709, β, is then determined based on first height 705, second height, $Z_A$, and the distance, L, using eq (3) as described at least with reference to FIG. 5.

At operation P707, a third tilt of substrate 321 along the x-axis is determined based on first tilt 707, second tilt 709 and an angle between the x-axis and axis of leveling sensor 430. For example, third tilt 711, γ, along the x-axis may be obtained based on first tilt 707, α, along axis CC', second tilt, β, along the y-axis, and θ, which is the angle between the x-axis and the BB' axis of leveling sensor 430, using eq. 4-7 as described at least with reference to FIG. 5.

After obtaining one or more of the above tilt measurements, height controller 340 may be configured to adjust the height of stage 320 based on the above tilt measurements such that substrate 321 is parallel to surface 460 of electron beam tool 310.

Figure 8:
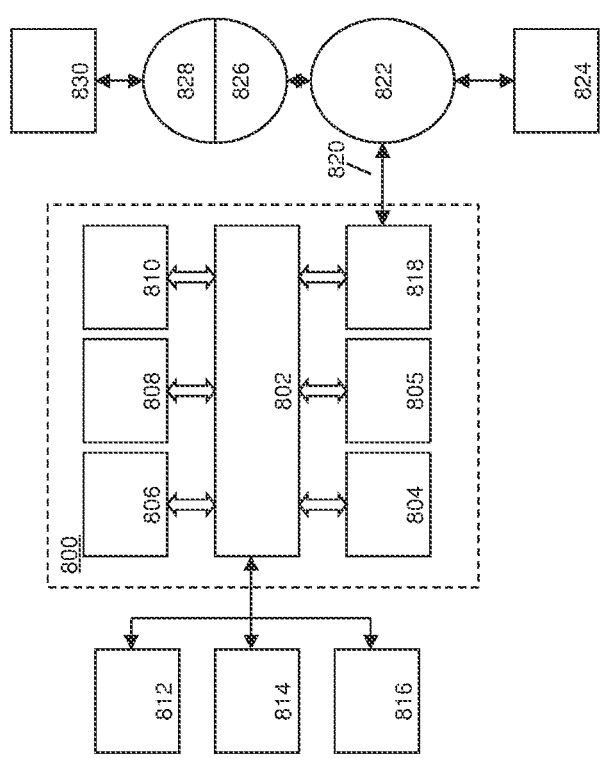
FIG. 8 is a block diagram that illustrates a computer system which can assist in implementing the methods, flows, modules, components, or the apparatus disclosed herein.

FIG. 8 is a block diagram that illustrates a computer system 800 which can assist in implementing the methods, flows, modules, components, or the apparatus disclosed herein. Computer system 800 includes a bus 802 or other communication mechanism for communicating information, and a processor 804 (or multiple processors 804 and 805) coupled with bus 802 for processing information. Computer system 800 also includes a main memory 806, such as a random-access memory (RAM) or other dynamic storage device, coupled to bus 802 for storing information and instructions to be executed by processor 804. Main memory 806 also may be used for storing temporary variables or other intermediate information during execution of instructions to be executed by processor 804. Computer system 800 further includes a read only memory (ROM) 808 or other static storage device coupled to bus 802 for storing static information and instructions for processor 804. A storage device 810, such as a magnetic disk or optical disk, is provided and coupled to bus 802 for storing information and instructions.

Computer system 800 may be coupled via bus 802 to a display 812, such as a cathode ray tube (CRT) or flat panel or touch panel display for displaying information to a computer user. An input device 814, including alphanumeric and other keys, is coupled to bus 802 for communicating information and command selections to processor 804. Another type of user input device is cursor control 816, such as a mouse, a trackball, or cursor direction keys for communicating direction information and command selections to processor 804 and for controlling cursor movement on display 812. This input device typically has two degrees of freedom in two axes, a first axis (e.g., x) and a second axis (e.g., y), that allows the device to specify positions in a plane. A touch panel (screen) display may also be used as an input device.

According to one embodiment, portions of one or more methods described herein may be performed by computer system 800 in response to processor 804 executing one or more sequences of one or more instructions contained in main memory 806. Such instructions may be read into main memory 806 from another computer-readable medium, such as storage device 810. Execution of the sequences of instructions contained in main memory 806 causes processor 804 to perform the process steps described herein. One or more processors in a multi-processing arrangement may also be employed to execute the sequences of instructions contained in main memory 806. In an alternative embodiment, hardwired circuitry may be used in place of or in combination with software instructions. Thus, the description herein is not limited to any specific combination of hardware circuitry and software.

The term "computer-readable medium" as used herein refers to any medium that participates in providing instructions to processor 804 for execution. Such a medium may take many forms, including but not limited to, non-volatile media, volatile media, and transmission media. Non-volatile media include, for example, optical or magnetic disks, such as storage device 810. Volatile media include dynamic memory, such as main memory 806. Transmission media include coaxial cables, copper wire and fiber optics, including the wires that comprise bus 802. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 804 for execution. For example, the instructions may initially be borne on a magnetic disk of a remote computer. The remote computer can load the instructions into its dynamic memory and send the instructions over a telephone line using a modem. A modem local to computer system 800 can receive the data on the telephone line and use an infrared transmitter to convert the data to an infrared signal. An infrared detector coupled to bus 802 can receive the data carried in the infrared signal and place the data on bus 802. Bus 802 carries the data to main memory 806, from which processor 804 retrieves and executes the instructions. The instructions received by main memory 806 may optionally be stored on storage device 810 either before or after execution by processor 804.

Computer system 800 may also include a communication interface 818 coupled to bus 802. Communication interface 818 provides a two-way data communication coupling to a network link 820 that is connected to a local network 822. For example, communication interface 818 may be an integrated services digital network (ISDN) card or a modem to provide a data communication connection to a corresponding type of telephone line. As another example, communication interface 818 may be a local area network (LAN) card to provide a data communication connection to a compatible LAN. Wireless links may also be implemented. In any such implementation, communication interface 818 sends and receives electrical, electromagnetic, or optical signals that carry digital data streams representing various types of information.

Network link 820 typically provides data communication through one or more networks to other data devices. For example, network link 820 may provide a connection through local network 822 to a host computer 824 or to data equipment operated by an Internet Service Provider (ISP) 826. ISP 826 in turn provides data communication services through the worldwide packet data communication network, now commonly referred to as the "Internet" 828. Local network 822 and Internet 828 both use electrical, electromagnetic, or optical signals that carry digital data streams. The signals through the various networks and the signals on network link 820 and through communication interface 818, which carry the digital data to and from computer system 800, are exemplary forms of carrier waves transporting the information.

Computer system 800 can send messages and receive data, including program code, through the network(s), network link 820, and communication interface 818. In the Internet example, a server 830 might transmit a requested code for an application program through Internet 828, ISP 826, local network 822 and communication interface 818. One such downloaded application may provide all or part of a method described herein, for example. The received code may be executed by processor 804 as it is received, and/or stored in storage device 810, or other non-volatile storage for later execution. In this manner, computer system 800 may obtain application code in the form of a carrier wave.

Embodiments are provided according to the following clauses:

1. An inspection apparatus comprising:
    a radiation source configured to provide a radiation beam;
    a beam splitter configured to split the radiation beam into multiple beamlets that each reflect off a substrate; and
    multiple light reflecting components, wherein each light reflecting component is associated with one of the beamlets and is configured to support a different target height for the substrate by enabling detection of a height or a levelness of the substrate based on the associated beamlet reflecting off the substrate.

2. The inspection apparatus of clause 1, further comprising:
    a detector configured to detect multiple images of a pattern projected on the substrate by receiving the beamlets from the light reflecting components, wherein each image is formed by a different beamlet.

3. The inspection apparatus of clause 2, further comprising:
    controller circuitry configured to:
    compare a first image of the images with a reference image corresponding to a first target height of the different target heights, and
    determine a first deviation value for the substrate from the first target height based on the comparison.

4. The inspection apparatus of clause 3, wherein the first image is formed by one of the beamlets associated with one of the light reflecting components, wherein the one of the light reflecting components is configured to enable measurement of the first deviation value of the substrate for the first target height.

5. The inspection apparatus of clause 3 further comprising:
    a stage motion controller having circuitry configured to adjust a height of a stage that is configured to hold the substrate to position the substrate at the first target height, wherein the height of the stage is adjusted based on the first deviation value.

6. The inspection apparatus of clause 3 further comprising:
    a beam controller to adjust a focus of a charged-particle beam incident on the substrate to compensate, at least in part, for the first deviation value.

7. The inspection apparatus of clause 3, wherein the controller circuitry is configured to compare the first image with the reference image by:

generating the first image as a light intensity image of the pattern, and conducting a cross-correlation between the light intensity image and the reference image to determine the first deviation value.

8. The inspection apparatus of clause 3, wherein the reference image is obtained by projecting the pattern on a surface of a reference substrate.

9. The inspection apparatus of clause 1, wherein the radiation source is configured to provide at least one of a broadband or a narrowband radiation.

10. The inspection apparatus of clause 1, wherein the radiation source is configured to merge radiation from multiple narrowband sources to form a broadband radiation, and wherein each beamlet contains light of multiple wavelengths.

11. The inspection apparatus of clause 10, wherein the light of multiple wavelengths facilitates minimizing an error in detection of the height caused due to a variation of a material of the substrate.

12. The inspection apparatus of clause 1, wherein the radiation source includes a prism to merge radiation from multiple narrowband sources.

13. The inspection apparatus of clause 1, wherein the radiation source includes a plurality of dichromic mirrors to merge radiation from multiple narrow band sources.

14. The inspection apparatus of clause 1, wherein the beam splitter includes a set of light splitting components, wherein the set of light splitting components are configured with different ratios of reflection to transmission to direct each of the beamlets on the substrate with the same energy.

15. The inspection apparatus of clause 1, wherein the multiple light reflecting components includes beam splitters, and wherein at least a portion of all the beamlets that reflect off the substrate are received by a single light detector.

16. The inspection apparatus of clause 1, wherein each of the beamlets that reflects off of the substrate is received by a different detector.

17. The inspection apparatus of clause 1, wherein the multiple light reflecting components includes mirrors, and wherein each of the beamlets that reflects off the substrate is received by a different detector.

18. The inspection apparatus of clause 3, wherein the controller circuitry is configured to:

determine a first height of the substrate based on the first deviation value, and determine a first tilt of the substrate along a first axis based on the first height, wherein the first axis is perpendicular to a specified axis along which the beam splitter and the light reflecting components are aligned.

19. The inspection apparatus of clause 18, wherein the controller circuitry is configured to:

adjust the first height to a second height at which the substrate is in a focus plane of an optical microscope of the inspection apparatus, wherein the optical microscope is positioned along an x-axis of the substrate, and determine a second tilt of the substrate along a y-axis based on the first height, the second height and a distance along the x-axis between a reference point associated with the inspection apparatus and a center of the optical microscope.

20. The inspection apparatus of clause 19, wherein the controller circuitry is configured to:

determine a third tilt of the substrate along the x-axis based on the first tilt, the second tilt, and an angle between the x-axis and the specified axis, and determine the levelness based on the first tilt, the second tilt, or the third tilt, wherein the levelness indicates whether the substrate is parallel to a reference surface of the inspection apparatus.

21. The inspection apparatus of clause 1, wherein each of the target heights is a distance between a portion of the inspection apparatus and a target plane in z-axis at which a charged-particle beam of a specified landing energy focuses on the substrate.

22. A multi-working height inspection apparatus comprising:

a stage configured to hold a substrate at one of a plurality of target heights;

a level sensor comprising:

a radiation source configured to provide a radiation beam, a beam splitter configured to split the radiation beam into multiple beamlets that each reflect off the substrate, multiple light reflecting components, wherein each light reflecting component is associated with one of the beamlets and is configured to support a different target height for the substrate by enabling detection of a height or a levelness of the substrate based on the beamlet reflecting off the substrate, and a detector configured to detect an image from at least one of the beamlets that reflect off the substrate; and controller circuitry configured to compare a first image of the images with a reference image corresponding to a first target height of the target heights to determine a deviation value for the substrate from the first target height.

23. The multi-working height inspection apparatus of clause 22, wherein the controller circuitry is configured to generate a control signal to adjust a height of the stage based on the deviation value to position the substrate at the first target height.

24. The multi-working height inspection apparatus of clause 22, wherein the controller circuitry is configured to generate a control signal to adjust a focus of a charged-particle beam incident on the substrate to compensate, at least in part, for the deviation value.

25. The multi-working height inspection apparatus of clause 22, wherein the first image is formed by one of the beamlets associated with one of the light reflecting components configured to enable measurement of the deviation value of the substrate for the first target height.

26. The multi-working height inspection apparatus of clause 22, wherein each of the target heights is a distance between a portion of the multi-working height inspection apparatus and a target plane in a z-axis at which a charged-particle beam of a specified landing energy focuses on the substrate.

27. The multi-working height inspection apparatus of clause 22, wherein the controller circuitry is configured to:

determine a first height of the stage based on the deviation value, determine a first tilt of the substrate along a first axis based on the first height, wherein the first axis is perpendicular to an axis of the level sensor, determine a second tilt of the substrate along a y-axis of the substrate based on the first height, a second height and a distance on an x-axis of the substrate between a center of a charged-particle beam tool and a center of an optical microscope of the multi-working height inspection apparatus, wherein the second height corresponds to the height of the stage at which the substrate is in a focus plane of the optical microscope, and determine a third tilt of the substrate along the x-axis based on the first tilt, the second tilt, and an angle between the x-axis and the axis of the level sensor.

28. The multi-working height inspection apparatus of clause 27, wherein the controller circuitry is configured to determine the levelness based on the first tilt, the second tilt, or the third tilt, wherein the levelness indicates whether the substrate is parallel to the charged-particle beam tool of the multi-working height inspection apparatus.

29. The multi-working height inspection apparatus of clause 22, wherein when the multiple reflecting components includes beam splitters, at least a portion of all the beamlets that reflect off the substrate are received by a single light detector.

30. The multi-working height inspection apparatus of clause 22, wherein when the multiple light reflecting components includes dichromic mirrors, each of the beamlets that reflect off the substrate are received by a different light detector.

31. The multi-working height inspection apparatus of clause 22, wherein the radiation source includes a prism to merge radiation from multiple narrowband sources.

32. The multi-working height inspection apparatus of clause 22, wherein the radiation source includes a plurality of dichromic mirrors to merge radiation from multiple narrowband sources.

33. The multi-working height inspection apparatus of clause 22, wherein the detector is configured to detect an image of the substrate from each of the beamlets.

34. The multi-working height inspection apparatus of clause 22, wherein the detector includes a camera, which includes multiple sensors, each sensor being configured to detect an image of the substrate from one of the beamlets.

35. The multi-working height inspection apparatus of clause 22, wherein the detector includes multiple cameras, each camera being configured to detect an image of the substrate from one of the beamlets.

36. A method for adjusting a working height for a substrate in an inspection system comprising a level sensor, the method comprising:

projecting a pattern on a substrate by a radiation beam from a radiation source of the level sensor, wherein the radiation beam is split into multiple beamlets that each reflect off the substrate;

generating multiple images of the pattern by receiving the beamlets that reflect off the substrate, wherein each image is formed by a different beamlet and supports measurement of a deviation value of the substrate from a different target height; and determining a first deviation value of the substrate from a first target height based on a first image of the images that supports measurement of the deviation value of the substrate from the first target height.

37. The method of clause 36 further comprising:

adjusting a height of the substrate based on the first deviation value to position the substrate at the first target height.

38. The method of clause 36 further comprising:

adjusting a focus of a charged-particle beam incident on the substrate to compensate, at least in part, for the first deviation value.

39. The method of clause 36, wherein determining the deviation value includes:

comparing the first image with a reference image corresponding to the first target height; and determining the first deviation value of the substrate based on the comparison.

40. The method of clause 36, wherein generating the multiple images includes:

generating the first image from one of the beamlets associated with one of a multiple light reflecting components of the level sensor configured to enable measurement of the deviation value of the substrate for the first target height, wherein each reflecting component is configured to enable measurement of the deviation value of the substrate for a different target height.

41. The method of clause 36 further comprising:

determining a levelness of the substrate, which indicates whether the substrate is parallel with respect to a reference surface of the inspection system.

42. The method of clause 41, wherein determining the levelness includes:

determining a first height of the substrate based on the first deviation value, determining a first tilt of the substrate along a first axis based on the first height, wherein the first axis is perpendicular to an axis of the level sensor, determining a second tilt of the substrate along a y-axis based on the first height, a second height and a distance on an x-axis of the substrate between a reference point of the inspection system and a center of an optical microscope of the inspection system, wherein the second height corresponds to a height of the substrate at which the substrate is in a focus plane of the optical microscope, and determining a third tilt of the substrate along the x-axis based on the first tilt, the second tilt, and an angle between the x-axis and the axis of the level sensor.

43. A non-transitory computer-readable medium having instructions that, when executed by a computer, cause the computer to execute a method for adjusting a working height for a substrate in an inspection system comprising a level sensor, the method comprising:

projecting a pattern on a substrate by a radiation beam from a radiation source of the level sensor, wherein the radiation beam is split into multiple beamlets that each reflect off the substrate;

generating multiple images of the pattern by receiving the beamlets that reflect off the substrate, wherein each image is formed by a different beamlet and supports measurement of a deviation value of the substrate from a different target height; and determining a first deviation value of the substrate from a first target height based on a first image of the images that supports measurement of the deviation value of the substrate from the first target height.

44. A non-transitory computer-readable medium having instructions recorded thereon, the instructions when executed by a computer implementing the method of any of the above clauses.

A non-transitory computer readable medium may be provided that stores instructions for a processor of a controller (e.g., controller 50 of FIG. 1) to carry out, among other things, image inspection, image acquisition, stage positioning, beam focusing, electric field adjustment, beam bending, condenser lens adjusting, activating charged-particle source, beam deflecting, and at least a portion of processes 600 and 700. Common forms of non-transitory media include, for example, a floppy disk, a flexible disk, hard disk, solid state drive, magnetic tape, or any other magnetic data storage medium, a Compact Disc Read Only Memory (CD-ROM), any other optical data storage medium, any physical medium with patterns of holes, a Random Access Memory (RAM), a Programmable Read Only Memory (PROM), and Erasable Programmable Read Only Memory (EPROM), a FLASH-EPROM or any other flash memory, Non-Volatile Random Access Memory (NVRAM), a cache, a register, any other memory chip or cartridge, and networked versions of the same.

Relative dimensions of components in drawings may be exaggerated for clarity. Within the description of drawings, the same or like reference numbers refer to the same or like components or entities, and only the differences with respect to the individual embodiments are described. As used herein, unless specifically stated otherwise, the term "or" encompasses all possible combinations, except where infeasible. For example, if it is stated that a component may include A or B, then, unless specifically stated otherwise or infeasible, the component may include A, or B, or A and B. As a second example, if it is stated that a component may include A, B, or C, then, unless specifically stated otherwise or infeasible, the component may include A, or B, or C, or A and B, or A and C, or B and C, or A and B and C.

It will be appreciated that the embodiments of the present disclosure are not limited to the exact construction that has been described above and illustrated in the accompanying drawings, and that various modifications and changes may be made without departing from the scope thereof. The present disclosure has been described in connection with various embodiments, other embodiments of the invention will be apparent to those skilled in the art from consideration of the specification and practice of the invention disclosed herein. It is intended that the specification and examples be considered as exemplary only, with a true scope and spirit of the invention being indicated by the following claims.

The descriptions above are intended to be illustrative, not limiting. Thus, it will be apparent to one skilled in the art that modifications may be made as described without departing from the scope of the claims set out below.

The invention claimed is:

1. An inspection apparatus comprising:
   a beam splitter configured to split a radiation beam into multiple beamlets that each reflect off a substrate; and
   multiple radiation reflecting components, wherein each radiation reflecting component is associated with one of the beamlets and is configured to support a different target height for the substrate by enabling detection of a height or a levelness of the substrate based on the associated beamlet reflecting off the substrate,
   wherein the beam splitter is configured to provide one of the beamlets at a different incidence angle on the substrate than another one of the beamlets and/or the multiple radiation reflecting components are arranged to provide the beamlets on the substrate and such that one of the radiation reflecting components is oriented at a different angle than another one of the radiation reflecting components.

2. The inspection apparatus of claim 1, further comprising a detector configured to detect multiple images of a pattern projected on the substrate by receiving the beamlets from the radiation reflecting components, wherein each image is formed by a different beamlet.

3. The inspection apparatus of claim 2, further comprising controller circuitry configured to:
   compare a first image of the images with a reference image corresponding to a first target height of the different target heights, and
   determine a first deviation value for the substrate from the first target height based on the comparison.

4. The inspection apparatus of claim 3, wherein the first image is formed by one of the beamlets associated with one of the radiation reflecting components, and wherein the one of the radiation reflecting components is configured to enable measurement of the first deviation value of the substrate for the first target height.

5. The inspection apparatus of claim 3, further comprising a stage motion controller having circuitry configured to adjust a height of a stage that is configured to hold the substrate to position the substrate at the first target height, wherein the height of the stage is adjusted based on the first deviation value.

6. The inspection apparatus of claim 3, further comprising a beam controller to adjust a focus of a charged-particle beam incident on the substrate to compensate, at least in part, for the first deviation value.

7. The inspection apparatus of claim 3, wherein the controller circuitry is configured to compare the first image with the reference image by:
   generating the first image as a radiation intensity image of the pattern, and
   conducting a cross-correlation between the radiation intensity image and the reference image to determine the first deviation value.

8. The inspection apparatus of claim 3, wherein the reference image is obtained by projecting the pattern on a surface of a reference substrate.

9. The inspection apparatus of claim 1, further comprising a radiation source configured to provide a broadband or a narrowband radiation.

10. The inspection apparatus of claim 1, further comprising a radiation source configured to merge radiation from multiple narrowband sources to form a broadband radiation, and wherein each beamlet contains radiation of multiple wavelengths.

11. The inspection apparatus of claim 10, wherein the radiation of multiple wavelengths facilitates minimizing an error in detection of height caused due to a variation of a material of the substrate.

12. The inspection apparatus of claim 1, further comprising a prism to merge radiation from multiple narrowband sources.

13. The inspection apparatus of claim 1, further comprising a plurality of dichromic mirrors to merge radiation from multiple narrow band sources.

14. The inspection apparatus of claim 1, further comprising a beam splitter that includes a set of radiation splitting components, wherein the set of radiation splitting components are configured with different ratios of reflection to transmission to direct each of the beamlets on the substrate with the same energy.

15. A non-transitory computer-readable medium having instructions therein, the instructions, when executed by a computer system, configured to cause the computer system to at least:
   obtain multiple images of a pattern generated by receipt by a level sensor of an inspection system of a plurality of beamlets that reflect off a substrate, wherein each image is formed by a different beamlet and supports measurement of a deviation value of the substrate from a different target height; and
   determine a first deviation value of the substrate from a first target height based on a first image of the images that supports measurement of the deviation value of the substrate from the first target height and a second deviation value of the substrate from a second target height different from the first target height based on a second image of the images that supports measurement of the deviation value of the substrate from the second target height.

16. The medium of claim 15, wherein the instructions are further configured to compare the first image with a reference image by:

generation of the first image as a radiation intensity image of the pattern, and conducting of a cross-correlation between the radiation intensity image and the reference image to determine the first deviation value.

17. The medium of claim 15, wherein the instructions are further configured to cause adjustment of a height of a stage that is configured to hold the substrate to position the substrate at the first target height, wherein the height of the stage is adjusted based on the first deviation value.

18. The medium of claim 15, wherein the instructions are further configured to cause adjustment of a focus of a charged-particle beam incident on the substrate to compensate, at least in part, for the first deviation value.

19. The medium of claim 15, wherein the instructions are further configured to:
compare the first image with a reference image corresponding to the first target height, and
determine the first deviation value for the substrate from the first target height based on the comparison.

20. An inspection apparatus comprising:
multiple radiation reflecting components, wherein each radiation reflecting component is associated with one beamlet of a plurality of beamlets, is configured to provide a respective beamlet on a the substrate, and is configured to support a different target height for a substrate by enabling detection of a height or a levelness of the substrate based on the associated beamlet reflecting off the substrate; and a non-transitory computer-readable medium having instructions therein, the instructions, when executed by one or more processors, configured to cause the one or more processors to at least determine a first height or first deviation value from a target height using a first radiation reflecting component of the multiple radiation reflecting components but not a second radiation reflecting component of the multiple radiation reflecting components and determine a second height or second deviation value from a target height using the second radiation reflecting component of the multiple radiation reflecting components but not the first radiation reflecting component of the multiple radiation reflecting components.

* * * * *